US010074741B2

(12) United States Patent
Aichinger et al.

(10) Patent No.: US 10,074,741 B2
(45) Date of Patent: Sep. 11, 2018

(54) SEMICONDUCTOR DEVICE WITH TRENCH GATE STRUCTURE INCLUDING A GATE ELECTRODE AND A CONTACT STRUCTURE FOR A DIODE REGION

(71) Applicant: Infineon Technologies AG, Neubiberg (DE)

(72) Inventors: Thomas Aichinger, Villach (AT); Romain Esteve, Villach (AT); Dethard Peters, Hoechstadt (DE); Roland Rupp, Lauf (DE); Ralf Siemieniec, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 53 days.

(21) Appl. No.: 15/057,704

(22) Filed: Mar. 1, 2016

(65) Prior Publication Data
US 2016/0260829 A1      Sep. 8, 2016

(30) Foreign Application Priority Data

Mar. 3, 2015  (DE) .................. 10 2015 103 072

(51) Int. Cl.
*H01L 29/78* (2006.01)
*H01L 29/739* (2006.01)
(Continued)

(52) U.S. Cl.
CPC ...... *H01L 29/7804* (2013.01); *H01L 27/0629* (2013.01); *H01L 29/0619* (2013.01);
(Continued)

(58) Field of Classification Search
CPC ............ H01L 29/7804; H01L 29/7397; H01L 29/66348; H01L 29/7805; H01L 29/0878;
(Continued)

(56) References Cited

U.S. PATENT DOCUMENTS

| 5,082,795 A | 1/1992 | Temple |
| 2005/0032287 A1* | 2/2005 | Nakazawa ........ H01L 29/66727 438/197 |

(Continued)

FOREIGN PATENT DOCUMENTS

| DE | 102 24 201 | 1/2004 |
| DE | 102 24 201 A1 | 1/2004 |

(Continued)

OTHER PUBLICATIONS

Office Action communication of the German Patent and Trademark Office for Appln. Ser. No. 102015103072.1, dated Dec. 15, 2015.
(Continued)

*Primary Examiner* — Steven Loke
*Assistant Examiner* — Juanita Rhodes
(74) *Attorney, Agent, or Firm* — Slater Matsil, LLP

(57) ABSTRACT

A semiconductor device includes trench structures that extend from a first surface into a semiconductor body. The trench structures include a gate structure and a contact structure that extends through the gate structure, respectively. Transistor mesas are between the trench structures. Each transistor mesa includes a body zone forming a first pn junction with a drift structure and a second pn junction with a source zone. Diode regions directly adjoin one of the contact structures form a third pn junction with the drift structure, respectively.

23 Claims, 13 Drawing Sheets

(51) Int. Cl.
*H01L 29/66* (2006.01)
*H01L 29/08* (2006.01)
*H01L 29/40* (2006.01)
*H01L 29/417* (2006.01)
*H01L 27/06* (2006.01)
*H01L 29/872* (2006.01)
*H01L 29/36* (2006.01)
*H01L 29/861* (2006.01)
*H01L 29/04* (2006.01)
*H01L 29/06* (2006.01)

(52) U.S. Cl.
CPC ........ *H01L 29/0878* (2013.01); *H01L 29/401* (2013.01); *H01L 29/417* (2013.01); *H01L 29/66348* (2013.01); *H01L 29/66719* (2013.01); *H01L 29/66734* (2013.01); *H01L 29/7397* (2013.01); *H01L 29/7805* (2013.01); *H01L 29/7806* (2013.01); *H01L 29/7813* (2013.01); *H01L 29/045* (2013.01); *H01L 29/0626* (2013.01); *H01L 29/0696* (2013.01); *H01L 29/36* (2013.01); *H01L 29/41766* (2013.01); *H01L 29/6634* (2013.01); *H01L 29/66068* (2013.01); *H01L 29/861* (2013.01); *H01L 29/872* (2013.01)

(58) Field of Classification Search
CPC ............. H01L 29/7806; H01L 29/0619; H01L 29/401; H01L 29/417; H01L 27/0629; H01L 29/66719; H01L 29/66734; H01L 29/872; H01L 29/36; H01L 29/861; H01L 29/6634; H01L 29/0696; H01L 29/41766; H01L 29/66068; H01L 29/0626; H01L 29/045; H01L 29/7813
See application file for complete search history.

(56) References Cited

U.S. PATENT DOCUMENTS

| | | | |
|---|---|---|---|
| 2007/0267672 A1 | 11/2007 | Hokomoto | |
| 2009/0096019 A1* | 4/2009 | Girdhar | H01L 29/407 257/331 |
| 2011/0291110 A1* | 12/2011 | Suzuki | H01L 29/1095 257/77 |
| 2015/0028350 A1* | 1/2015 | Suvorov | H01L 29/1608 257/77 |

FOREIGN PATENT DOCUMENTS

| | | | | |
|---|---|---|---|---|
| DE | 10224201 A1 * | 1/2004 | ........ | H01L 29/7813 |
| EP | 0 746 030 A2 | 4/1996 | | |
| EP | 0 746 030 A2 | 12/1996 | | |
| JP | H05-007002 A | 1/1993 | | |
| JP | H06-029558 A | 2/1994 | | |
| JP | 2001-267570 A | 9/2001 | | |
| JP | 2005-057049 A | 3/2005 | | |
| JP | 2011-253837 A | 12/2011 | | |
| JP | WO 2013042333 A1 * | 3/2013 | ........ | H01L 21/0475 |
| WO | WO 2013/042333 A1 | 3/2013 | | |
| WO | WO 2014/178262 A1 | 11/2014 | | |

OTHER PUBLICATIONS

Office Action Communication of the Japanese Patent and Trademark Office re Application 2016-041283, dated May 17, 2017.
Office Action Communication of the German .Patent and Trademark Office re Application 10 2015 103 072.1, dated Dec. 15, 2015.

* cited by examiner

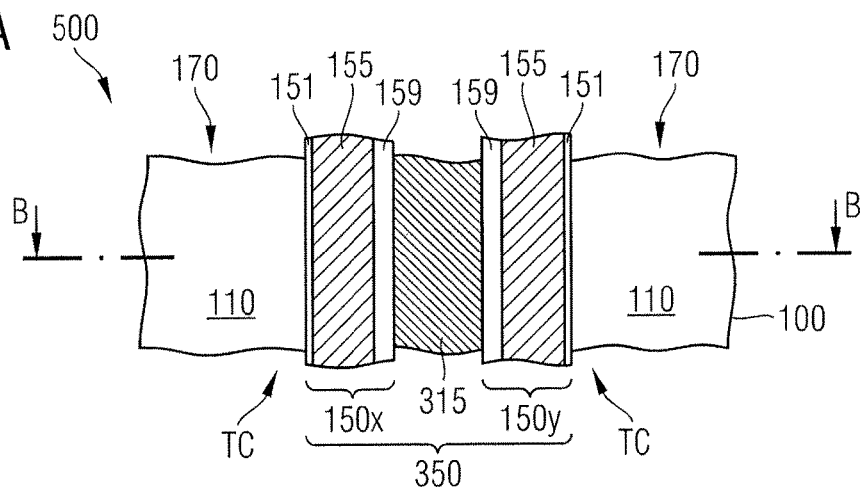
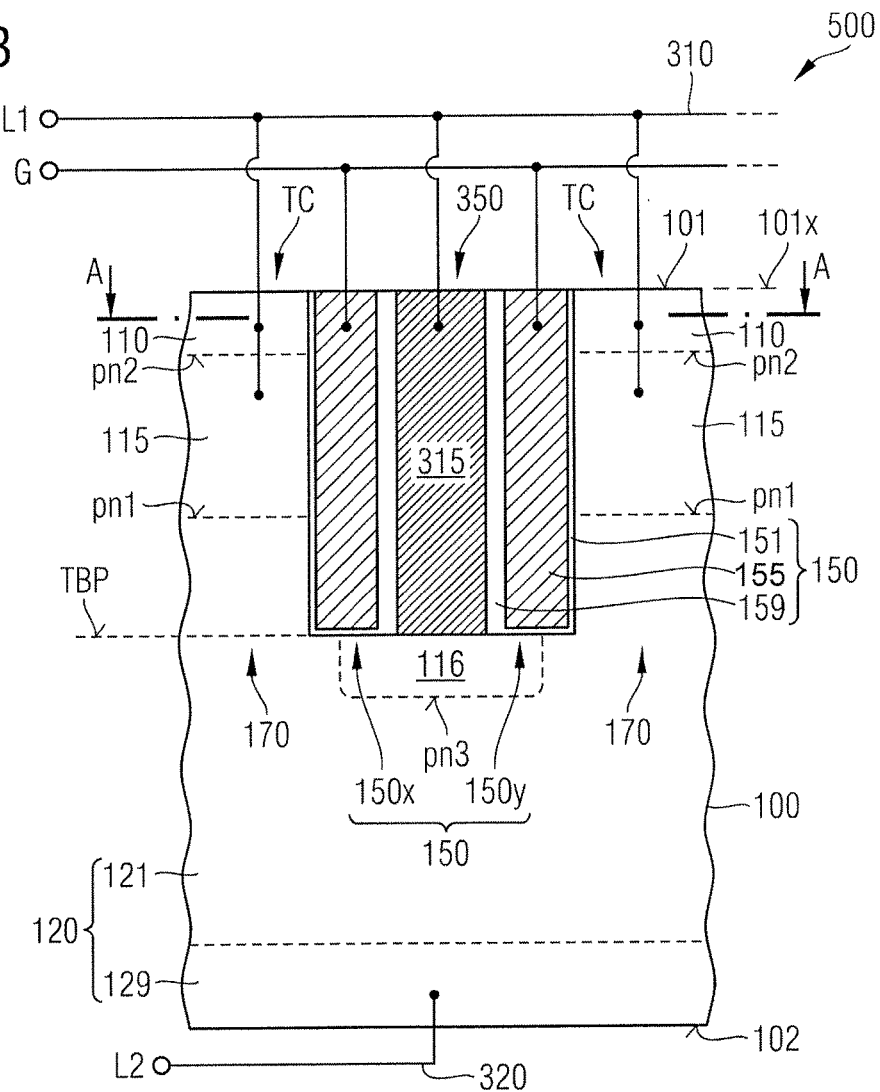

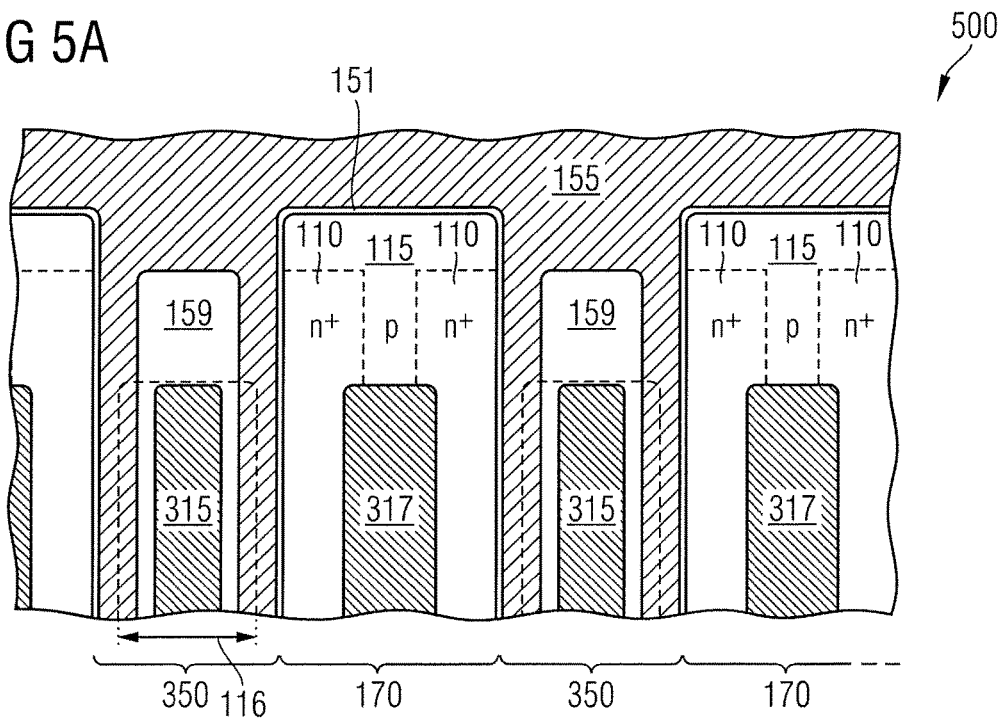
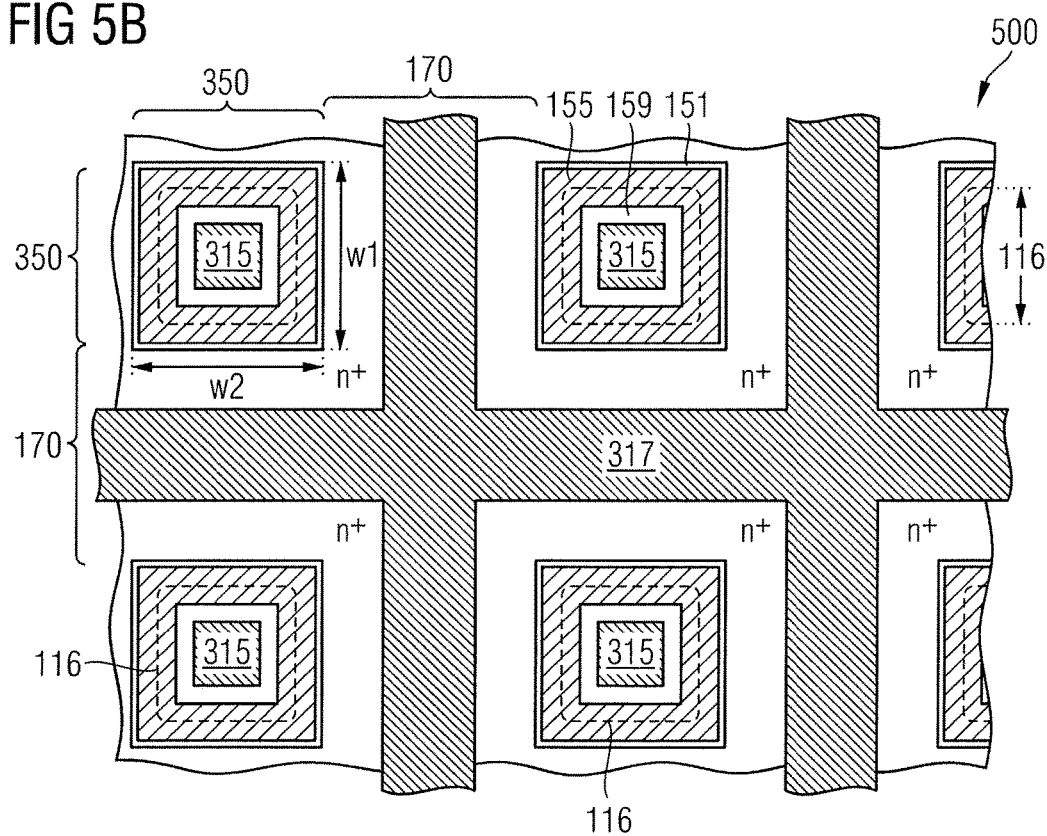

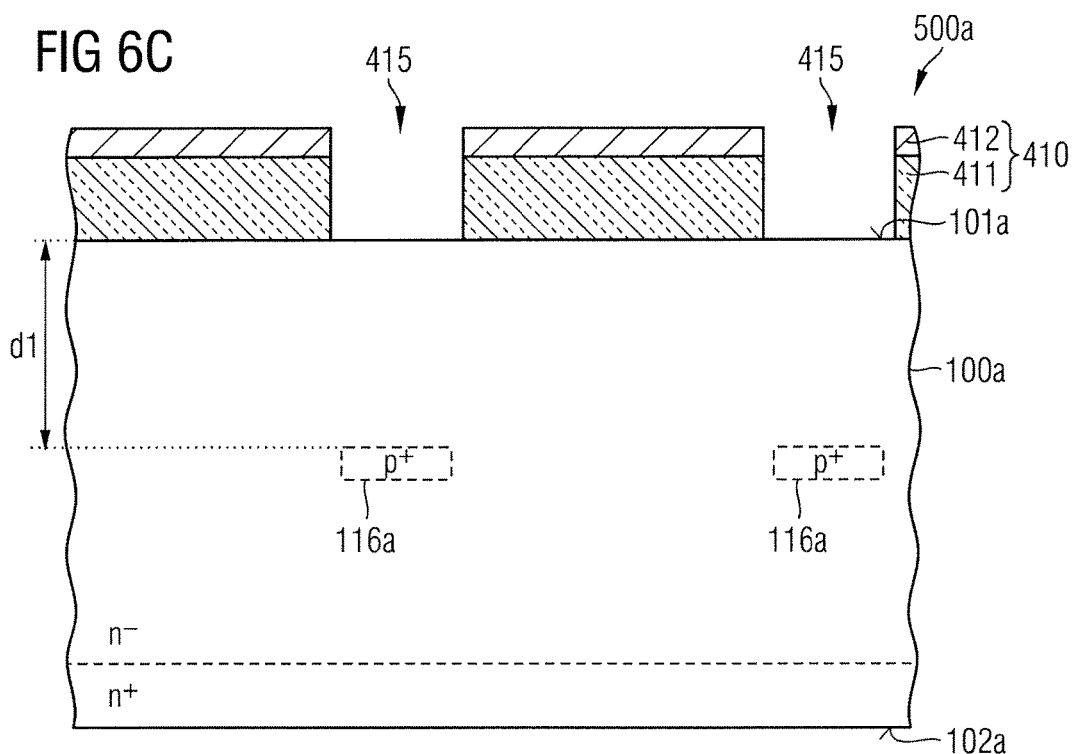
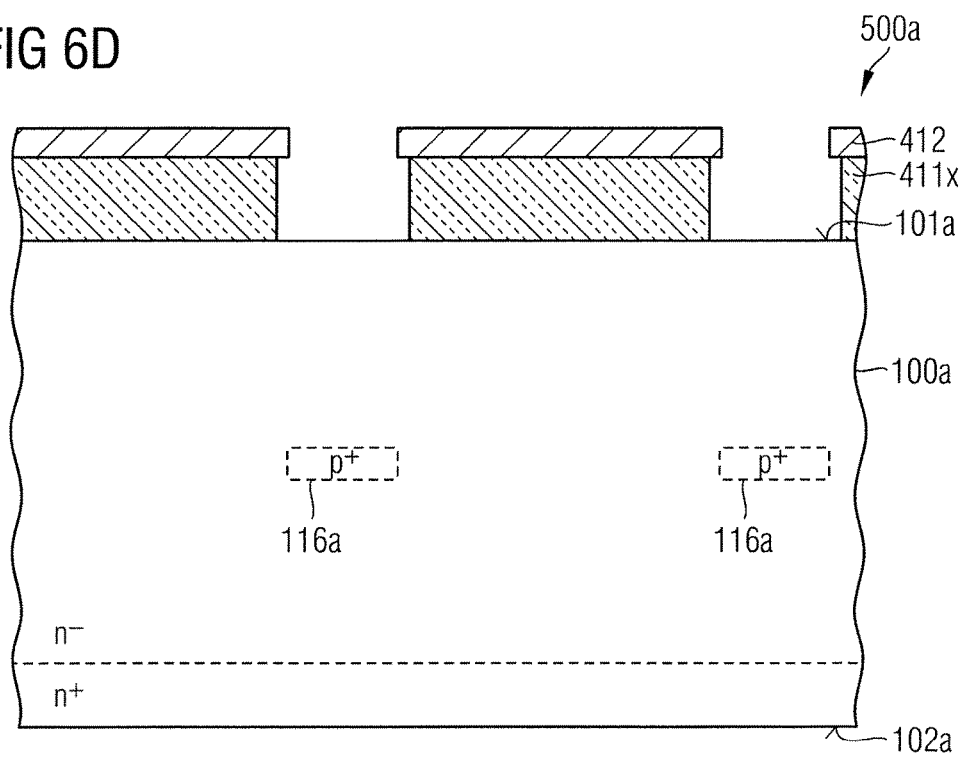

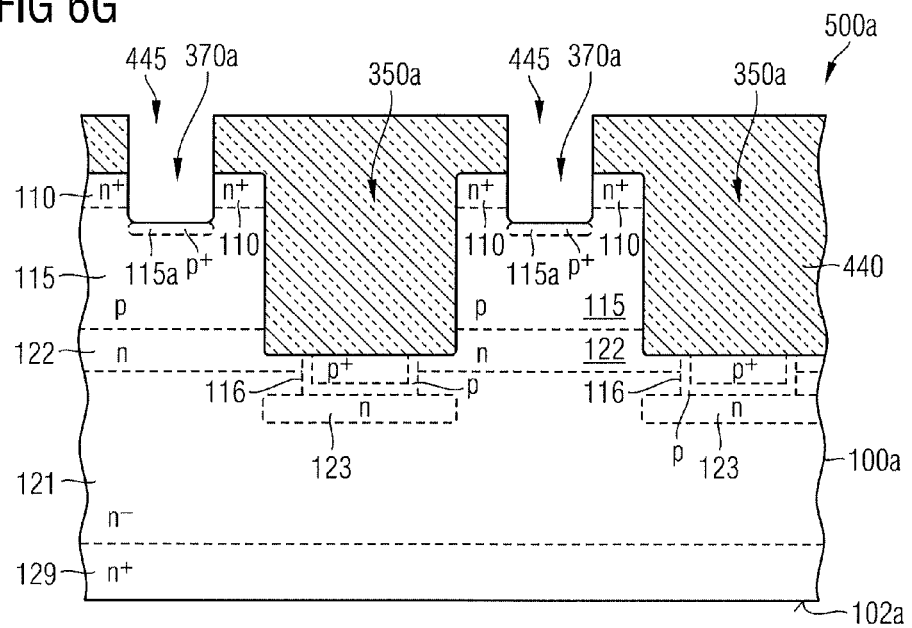
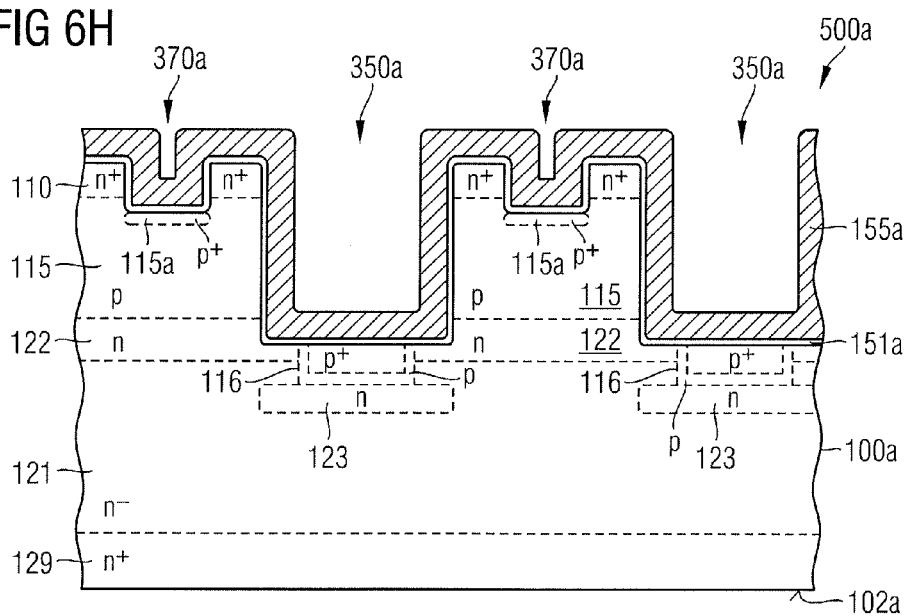

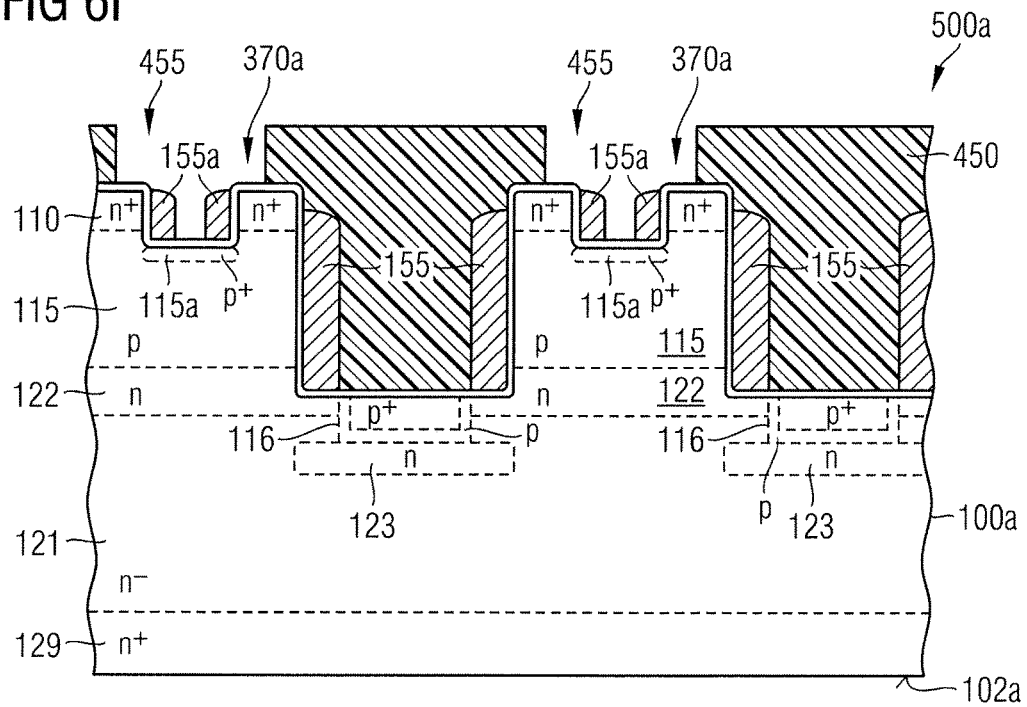
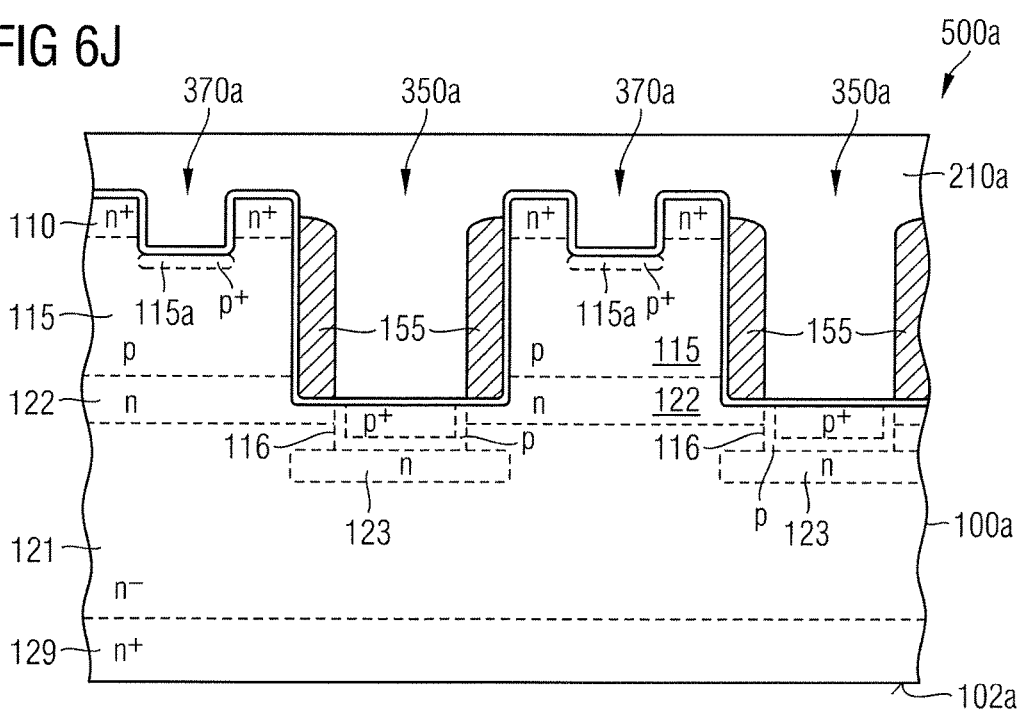

US 10,074,741 B2

SEMICONDUCTOR DEVICE WITH TRENCH GATE STRUCTURE INCLUDING A GATE ELECTRODE AND A CONTACT STRUCTURE FOR A DIODE REGION

CROSS-REFERENCE TO RELATED APPLICATION

This application claims priority to German Application Serial No. 102015103072.1 filed Mar. 3, 2015 and entitled "Semiconductor Device with Trench Gate Structure Including a Gate Electrode and a Contact Structure for a Diode Region".

BACKGROUND

Power semiconductor switches withstand a blocking voltage of several hundred Volts at high current rating. Typically, a load current through a power semiconductor switch flows in a vertical direction between two principal planes of a semiconductor body. Gate electrodes for controlling the load current may be formed as trench structures extending from one of the principal planes into the semiconductor body. In semiconductor materials with high electric field breakdown strength, shielding regions shield the gate dielectric against a strong electric field in the semiconductor body in a blocking state. The shielding regions may also be function as a body diode, opening a conductive path in the reverse biased state of the power semiconductor switch.

It is desirable to improve the characteristics of semiconductor devices like power semiconductor switches with high blocking capability and reverse conducting body diode.

SUMMARY

According to an embodiment a semiconductor device includes trench structures that extend from a first surface into a semiconductor body. The trench structures include a gate structure and a contact structure that extends through the gate structure, respectively. Transistor mesas are between the trench structures. Each transistor mesa includes a body zone forming a first pn junction with a drift structure and a second pn junction with a source zone. Diode regions directly adjoin one of the contact structures and form a third pn junction with the drift structure, respectively.

According to another embodiment a semiconductor device includes one or more trench structures, which extend from a first surface into a semiconductor body. The trench structures include a gate structure and a contact structure extending through the gate structure, respectively. The semiconductor device further includes transistor mesas between the trench structures, wherein each transistor mesa includes a body zone that forms a first pn junction with a drift structure and a second pn junction with a source zone. One or more diode regions form third pn junctions with the drift structure and directly adjoin one of the contact structures, respectively, wherein all direct connection lines between neighboring transistor mesas intersect one of the contact structures.

According to a further embodiment a method of manufacturing a semiconductor device includes forming trenches extending from a front side into a semiconductor substrate, wherein each trench extends down to a diode region, which is formed in the semiconductor substrate, and wherein in transistor mesas between the trenches body zones form first pn junctions with a drift structure and second pn junctions with source zones. The method further includes forming gate portions extending along opposite sidewalls of the trenches, respectively, and forming contact structures in the trenches between the gate portions, wherein the contact structures directly adjoin the diode regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic horizontal cross-sectional view of a portion of a semiconductor device according to an embodiment concerning a trench structure that includes a gate structure and a contact structure extending through the gate structure.

FIG. 1B is a schematic vertical cross-sectional view of the semiconductor device portion of FIG. 1A along line B-B.

FIG. 5A is a schematic horizontal cross-sectional view of a portion of a semiconductor device in accordance with an embodiment related to stripe-shaped trench structures.

FIG. 5B is a schematic horizontal cross-sectional view of a portion of a semiconductor device in accordance with an embodiment related to dot-shaped trench structures.

FIG. 6C shows the semiconductor substrate portion of FIG. 6B, after forming contact portions of diode regions by using a first mask.

FIG. 6D shows the semiconductor substrate portion of FIG. 6C, after recessing a first sublayer of the first mask.

FIG. 6G shows the semiconductor substrate portion of FIG. 6F, after forming contact grooves in transistor mesas between the trenches by using a fourth mask.

FIG. 6H shows the semiconductor substrate portion of FIG. 6G, after depositing a gate conductor layer lining the contact grooves and the trenches.

FIG. 6I shows the semiconductor substrate portion of FIG. 6H, after anisotropically recessing the deposited gate conductor layer and forming a fifth mask covering remnants of the gate conductor layer in the trenches and exposing remnants of the gate conductor layer in the contact grooves.

FIG. 6J is a schematic cross-sectional view of the semiconductor substrate portion of FIG. 6I, after removing the remnants of the gate conductor layer in the contact grooves and depositing an interlayer dielectric layer.

DETAILED DESCRIPTION

Figure 2A:
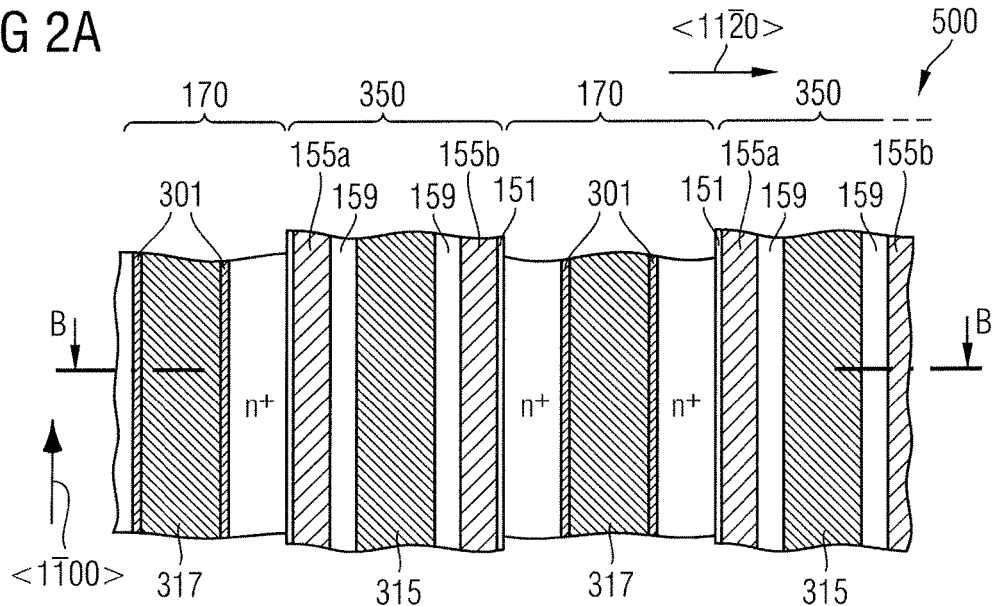
FIG. 2A is a schematic horizontal cross-sectional view of a portion of a semiconductor device in accordance with an embodiment related to mesa trench contact structures, current spread zones and avalanche regulation zones.

In the following detailed description, reference is made to the accompanying drawings, which form a part hereof and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. The present invention may include such modifications and variations. The examples are described using specific language that should not be construed as limiting the scope of the appending claims. The drawings are not to scale and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A and 1B refer to a semiconductor device 500 including transistor cells TC. The semiconductor device 500 may be or may include an IGFET (insulated gate field effect transistor), for example an MOSFET (metal oxide semiconductor FET) in the usual meaning including FETs with metal gates as well as FETs with non-metal gates, an IGBT (insulated gate bipolar transistor), or an MCD (MOS controlled diode), by way of example.

The semiconductor device 500 is based on a semiconductor body 100 from crystalline semiconductor material, such as silicon (Si), germanium (Ge), silicon germanium (SiGe) or an $A_{III}B_V$ semiconductor. According to an embodiment, the semiconductor material has a hexagonal crystal lattice such as silicon carbide (SiC) or an $A_{III}B_V$ semiconductor with hexagonal crystal lattice such as gallium nitride (GaN). According to an embodiment, the crystalline semiconductor material is silicon carbide of the 4H polytype (4H—SiC).

At a front side, the semiconductor body 100 has a first surface 101, which may be planar or which may include coplanar surface sections, wherein the planar first surface 101 or the coplanar surface sections may coincide with a main crystal plane or may be tilted to a main crystal plane by an off axis angle α, wherein α may be at least 3 degree and at most 12 degree, e.g., about 4 degree. According to other embodiments, the first surface 101 may include staggered, parallel surface sections, wherein the staggered surface sections are tilted to a mean surface plane 101x, which is given by the least squares mean plane. Second surface sections 101b, which are tilted to the first surface sections, may connect the staggered first surface sections 101a. On the back, an opposite second surface 102 may extend parallel to the planar first surface 101, parallel to coplanar surface sections of the first surface 101, or parallel or tilted to the mean surface plane 101x or may include staggered, parallel surface sections parallel to the surface sections on the first surface 101.

A distance between the first surface 101 at the front side and the second surface 102 on the back is related to a nominal blocking voltage the semiconductor device 500 is specified for. Typically, the semiconductor body 100 includes a first vertical portion that accommodates the applied electric field in the blocking state, wherein the thickness of the first portion is depends on the nominal blocking voltage and defines the electric field breakdown strength, whereas the thickness of further vertical portions, e.g., a substrate portion, is not related to the nominal blocking voltage.

A total thickness of the semiconductor body 100 between the first and second surfaces 101, 102 may be in the range of several hundred nm to several hundred μm. The normal to the first surface 101 defines a vertical direction and directions parallel to the first surface 101 are horizontal directions.

The transistor cells TC may be formed along trench structures 350 that extend from the first surface 101 to a trench bottom plane TBP in the semiconductor body 100. A vertical extension of the trench structures 350 may be in a range from 0.5 μm to 2 μm, by way of example. The trench structures 350 may form stripes extending from the first surface 101 that have longitudinal axes extend along a first horizontal direction. According to other embodiments, the trench structures 350 may be dot-shaped with both horizontal dimensions within the same order of magnitude. For example, a first horizontal dimension of dot-shaped trench structures 350 may deviate by not more than 5% from a second horizontal dimension orthogonal to the first horizontal dimension. According to another embodiment the trench structures 350 may form a grid. The trench structures 350 may be equally spaced from each other and may form a regular pattern, wherein a pitch (center-to-center distance) of the trench structures 350 may be in a range from 1 μm to 10 μm, e.g., from 2 μm to 5 μm.

Each trench structure 350 includes a gate structure 150 and a contact structure 315 that extends through the gate structure 150 to at least the trench bottom plane TBP, wherein the contact structure 315 partitions the gate structure 150 in two gate portions 150$x$, 150$y$ on opposite sides of the contact structure 315. The gate portions 150$x$, 150$y$ may be approximately symmetric with respect to a longitudinal center axis of the trench structure 350.

Each of the gate portions 150$a$, 150$b$ includes a portion of a conductive gate electrode 155 which may include or consist of a heavily doped polycrystalline silicon layer or a metal-containing layer. Each gate portion 150$x$, 150$y$ further includes a portion of a gate dielectric 151 separating the gate electrode 155 from the semiconductor body 100. The gate dielectric 151 may include or consist of aluminum nitride AlN, hafnium oxide HfO, or a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, or any combination thereof. The gate dielectric 151 may be formed for a threshold voltage of the transistor cells TC in a range from 1.5 V to 6 V.

Each gate portion 150$a$, 150$b$ further includes a gate insulator 159 directly adjoining the gate electrode 155 along a side oriented to the center of the trench structure 150. The gate insulator 159 may be thicker than the gate dielectric 151 and may consist of or include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The contact structure 315 is sandwiched between the two gate portions 150$x$, 150$y$, extends at least from the mean surface plane 101$x$ down to the bottom plane TBP, and may consist of or include a heavily doped semiconductor portion and/or one or more metal layer(s). According to an embodiment, the contact structure 315 may include an interface liner containing at least one of tantalum (Ta) and titanium (Ti), for example a tantalum nitride (TaN) or titanium nitride (TiN) layer, as well as a fill portion containing tungsten (W). The contact structure 315 may further include a low-ohmic contact layer directly adjoining the semiconductor body 100, for example a silicide layer formed exclusively at an interface with the semiconductor body 100.

Mesa portions of the semiconductor body 100 between neighboring trench structures 350 form transistor mesas 170 that include semiconducting portions of the transistor cells TC.

The transistor mesas 170 include source zones 110 that are oriented to the front side and that may directly adjoin the first surface 101. The source zones 110 may directly adjoin both neighboring trench structures 350 on opposite sides of the concerned transistor mesa 170. For example, each transistor mesa 170 includes two source zones 110, each of them directly adjoining one of the neighboring trench structures 350 and separated from each other by a contact structure or a doped region.

The transistor mesas 170 further include body zones 115 that separate the source zones 110 from a drift structure 120. The body zones 115 form first pn junctions pn1 with the drift structure 120 and second pn junctions pn2 with the source zones 110. Each body zone 115 extends from one of the trench structures 350 adjoining the concerned transistor mesa 170 to the other, opposite trench structure 350. The first pn junctions pn1 may extend over the whole width of the transistor mesa 170 between the two trench structures 350 sandwiching the concerned transistor mesa 170.

Both the source zones 110 and the body zones 115 are electrically connected to a first load electrode 310 at the front side. The body zones 115 are capacitively coupled to the gate electrode 155 through the gate dielectric 151. A vertical extension of the body zones 115 corresponds to a channel length of the semiconductor device 500 and may be in a range from 0.2 μm to 1.5 μm.

Diode regions 116 that form third pn junctions pn3 with the drift structure 120 are in a vertical projection of the trench structures 350 between the trench bottom plane TBP and the second surface 102. A width of the diode regions 116 in the cross-sectional plane may be smaller than the corresponding width of the trench structures 350. The diode regions 116 directly adjoin the contact structures 315. The contact structures 315 and the diode regions 116 form ohmic contacts and are electrically connected. The diode regions 116 may be spaced from the transistor mesas 170 along the horizontal direction. A distance between opposing edges of neighboring diode regions 116 may in a range from 2 μm to 3 μm, by way of example.

Each diode region 116 directly adjoins one of the contact structures 315 and partially or completely overlaps with the respective contact structure 315 in the vertical projection. In case the semiconductor device 500 includes dot-shaped or stripe-shaped trench structures 350, portions of the drift structure 120 separate neighboring diode regions 116 in the horizontal directions. In case the trench structure 350 is grid-shaped, all direct connection lines between all pairs of neighboring transistor mesas 170 cross one intermediate contact structure 315.

In both cases, a horizontal cross-sectional area of the diode region 116 may be geometrically similar to a horizontal cross-sectional area of the respective trench structure 350 or at least an outer contour of the diode region 116 may be geometrically similar to an outer contour of the respective trench structure 350, wherein two objects are geometrically similar when one can be obtained from the other by uniform scaling.

The drift structure 120 is oriented to the back, may directly adjoin the second surface 102 and may be electrically connected or coupled to a second load electrode 320 through an ohmic contact or a further pn junction. The drift structure 120 may include a lightly doped drift zone 121 that may form the first and third pn junctions pn1, pn3 as well as a heavily doped contact layer 129 between the drift zone 121 and the second surface 102. A net dopant concentration in the drift zone 121 may be in a range from 1E14 cm$^{-3}$ to 3E16 cm$^{-3}$ in case the semiconductor body 100 is formed from silicon carbide. The contact layer 129 may correspond to a substrate portion obtained from a crystal ingot, e.g., by sawing, whereas the portion of the semiconductor body 100 between the first surface 101 and the substrate portion may be grown by epitaxy on the substrate portion.

At least along the second surface 102, a dopant concentration in the contact layer 129 is sufficiently high to ensure an ohmic contact with the second load electrode 320 that directly adjoins the second surface 102. In case the semiconductor device 500 is a semiconductor diode or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), tin (Sn), platinum (Pt), molybdenum (Mo) and/or palladium (Pd). One of the first and second load electrodes 310, 320 or both may include two or more sub-layers, wherein each sub-layer may contain one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal L1, which may be an anode terminal of an MCD, a source terminal of an IGFET or an emitter terminal of an IGBT. The second load electrode 320 may form or may be electrically connected or coupled to a second load terminal L2, which may be a cathode terminal of an MCD, a drain terminal of an IGFET or a collector terminal of an IGBT.

The gate electrode 155 may be electrically connected to the first load electrode 310 in case the semiconductor device 500 is an MCD or to a gate pad formed at the front side in case the semiconductor device 500 is an IGFET or an IGBT, wherein the gate pad may form or may be electrically connected or coupled to a gate terminal G.

According to an embodiment, the transistor cells TC are n-channel FET cells with p-doped body regions 115, n-doped source zones 110, p-doped diode regions 116 and an n-doped drift zone 121. According to another embodiment, the transistor cells TC are p-channel FET cells with n-doped body regions 115 and p-doped source zones 110, wherein the diode regions 116 are n-doped and the drift zone 121 is p-doped.

When a potential at the gate electrode 155 exceeds or falls below a threshold voltage of the semiconductor device 500, minority charge carriers in the body zones 115 form inversion channels connecting the source zones 110 with the drift structure 120, thereby turning on the semiconductor device 500. In the on-state, a load current flows through the semiconductor body 100 approximately along the vertical direction between the first and second load electrodes 310, 320.

The third pn junctions pn3 between the diode regions 116 and the drift zone 121 form a body diode that is conductive when the semiconductor device 500 is reverse biased with a negative voltage applied between the second load electrode 320 and the first load electrode 310 or under avalanche conditions. The body diode feature may be used, e.g., in applications switching inductive loads, for instance, in a half bridge circuit, a full bridge circuit, a switched-mode power supply or in a circuit for controlling a cooking plate.

In the blocking state depletion zones extending from the vertical edges of the diode regions 116 below the trench structures 350 along the horizontal direction may deplete portions of the drift structure 120 in the vertical projection of active portions of the gate dielectrics 151 and may shield the active portions of the gate dielectric 151 against the blocking voltage applied to the second load electrode 320. In this way, the diode regions 116 reduce the electric field strength across the gate dielectric 151 such that device reliability is increased and DIBL (drain-induced barrier lowering) is reduced.

In the on-state, minority charge carriers in the body zones 115 form two inversion channels on both sides of the each transistor mesa 170 such that in each transistor mesa 170 two inversion channels facilitate a unipolar current flow through the body zones 115 between the source zones 110 and the drift structure 120. Compared to layouts using only one sidewall of a transistor mesa for the formation of inversion channels, the total active channel area is increased and, as a consequence, the on-state resistance reduced.

In addition, the contact structures 315 directly and vertically connect the diode regions 116 to the first load electrode 310 such that the forward resistance of the body diode is low and no lateral voltage drop occurs.

As a consequence, the diode regions 116 form a body diode that switches faster than body diodes including long horizontal portions without direct vertical contact.

Figure 2B:
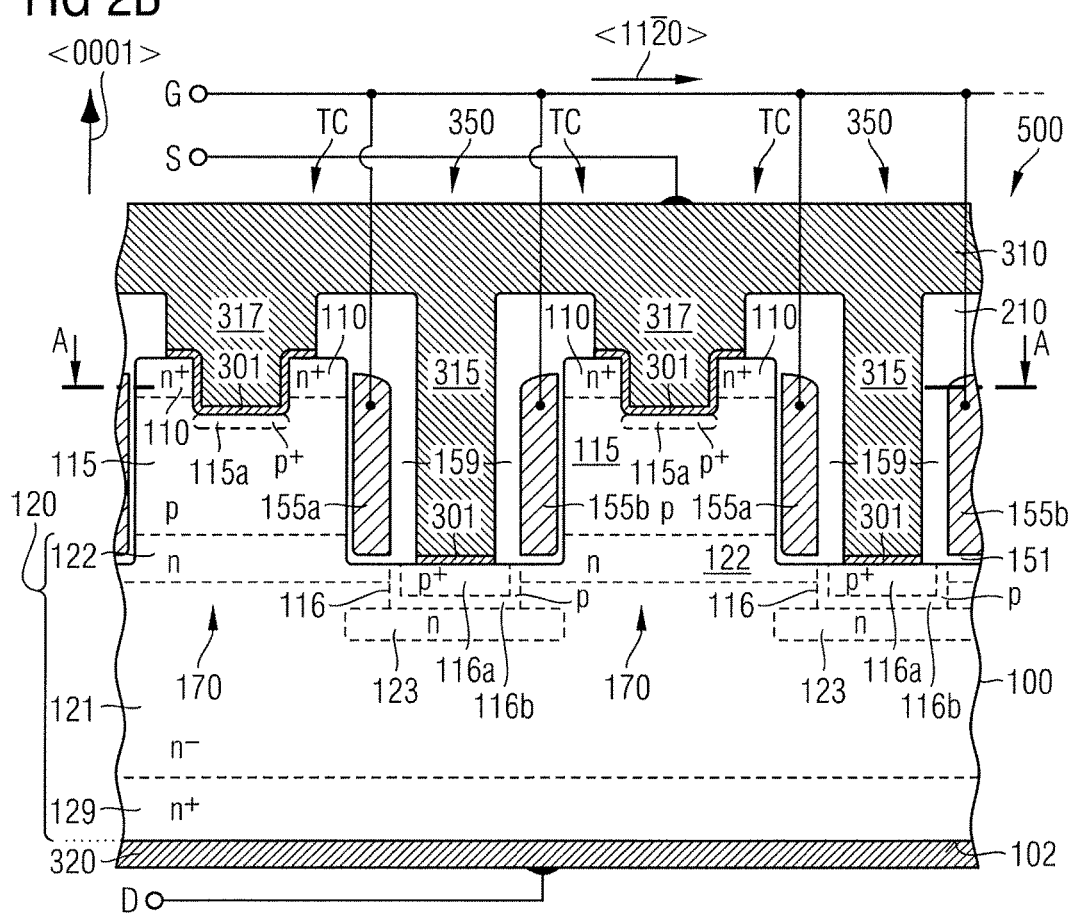
FIG. 2B is a schematic vertical cross-sectional view of the semiconductor device portion of FIG. 2A along line B-B.

The semiconductor device 500 of FIGS. 2A and 2B is an n-channel silicon carbide IGFET based on the semiconductor device 500 of FIGS. 1A to 1B, wherein the first load electrode 310 forms or is electrically connected or coupled to a source terminal S and the second load electrode 320 forms or is electrically connected to a drain terminal D.

In FIG. 2A the principal <0001> crystal direction may be slightly tilted to the perpendicular on the drawing plane. The <1-100> crystal direction may run parallel to the trench structures 350 and may be slightly tilted to the drawing plane by an off-axis angle α. Vertical sidewalls of the transistor mesas 170 may be {11-20} crystal planes like (11-20) and (-1-120) crystal planes.

In FIG. 2B the <0001> crystal direction is tilted by the off-axis angle α to the drawing plane and the <1-100> crystal direction is tilted by the off-axis angle α to the perpendicular onto the drawing plane.

The first surface 101 may be flat and tilted to the <1-100> crystal direction by the off axis angle α or may include staggered surface sections parallel to the <1-100> crystal direction. The trench structures 350 may be stripes, wherein in case of a staggered first surface 101, the trench structures orthogonally intersect steps formed between staggered surface sections in the first surface 101. The trench structures 350 may be equally spaced from each other, may have uniform width and may extend from one side of a transistor cell area to the opposite side.

Mesa contact structures 317 may extend from the first surface 101 into the transistor mesas 170. According to the illustrated embodiment the mesa contact structures 317 have a vertical extension greater than a distance between the second pn junctions pn2 and the first surface 101 but smaller than a distance between the first pn junctions pn1 and the first surface 101.

The contact structures 315 of the trench structures 350 directly adjoin diode regions 116 formed at least in the vertical projection of the trench structures 350 between the trench structures 350 and the second surface 102. The diode regions 116 form third pn junctions pn3 with the drift structure 120 wherein the third pn junctions pn3 form an integrated body diode. Portions of the diode regions 116 may overlap with the vertical projection of the transistor mesas 170. The diode regions 116 and depletion regions extending from the diode regions 116 into the drift structure 120 may shield active portions of the gate dielectric 151 against the high potential of the second load electrode 320 in the blocking state of the semiconductor device 500. A diode region 116 may include a heavily doped contact portion 116a directly adjoining the contact structure 315 and a lightly doped extension portion 116b forming an interface with the drift structure 120. The difference in dopant concentration between the contact and extension portions 116a, 116b may be at least a factor of two, e.g., at least one order of magnitude.

The drift structure 120 may include current spread zones 122 which may directly adjoin the body zones 115. The current spread zones 122 may extend between neighboring diode regions 116. Unipolar homojunctions between the current spread zones 122 and the drift zone 121 may have a smaller, the same, or a greater distance to the first surface 101 than the third pn junctions pn3 formed between the diode regions 116 and the drift zone 121. A mean dopant concentration in the current spread zones 122 is at least a factor of two, e.g., ten times as high as a mean dopant concentration in the drift zone 121. Portions of the current spread zones 122 may overlap with the vertical projection of the diode regions 116 and may extend between neighboring diode regions 116. The low horizontal resistance of the current spread zones may spread the unipolar charge carrier flow in the drift structure 120 along the horizontal directions.

A mesa contact structure 317 may split vertical sections of the transistor mesa 170 in two portions on both sides of the intermediate mesa contact structure 317, wherein each portion may include the semiconducting portion of a transistor cell TC. The vertical extension of the mesa contact structures 317 may be smaller than the vertical extension of the trench structures 350 such that the mesa contact structures 317 do not completely partition the body regions 115. A heavily doped contact region 115a of the conductivity type of the body zones 115 may be formed in the vertical projection of the mesa contact structure 317 to electrically connect the concerned body zone 115 through the mesa contact structure 317 with the first load electrode 310. The mesa contact structures 317 as well as the contact structures 315 may include a contact layer 301 formed from a metal silicide.

An interlayer dielectric 210 may be sandwiched between the first load electrode 310 and the gate electrode 155 and dielectrically insulates the first load electrode 310 from the gate electrode 155. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

In addition or alternatively to the current spread zones 122, the drift structure 120 may include avalanche regulation zones 123 forming at least portions of the third pn junctions pn3. The avalanche regulation zones 123 may be formed in the vertical projection of the trench structures 350 and may have a greater horizontal extension than the diode regions 116. A mean dopant concentration in the avalanche regulation zones 123 may be at least twice, for example five times or at least ten times as high as in the drift zone 121. The presence of the avalanche regulation zones 123 may reduce the impact of variations of the epitaxial layer thickness and dopant concentrations.

In addition, the avalanche regulation zones 123 locally lower the breakdown voltage within the transistor cell area including a plurality of transistor cells TC and ensure that the avalanche breakdown starts within the transistor cell area. When the avalanche breakdown starts in the transistor cell area, the avalanche current spreads over the full transistor cell area, whereas an avalanche breakdown triggered in an edge or termination area, which typically surrounds the transistor cell area and which does not include transistor cells, affects only a smaller portion of the semiconductor body 100 and results in high local heating. As By pinning the avalanche breakdown in the transistor cell area, the avalanche regulation zones 123 improve avalanche ruggedness.

Figure 3A:
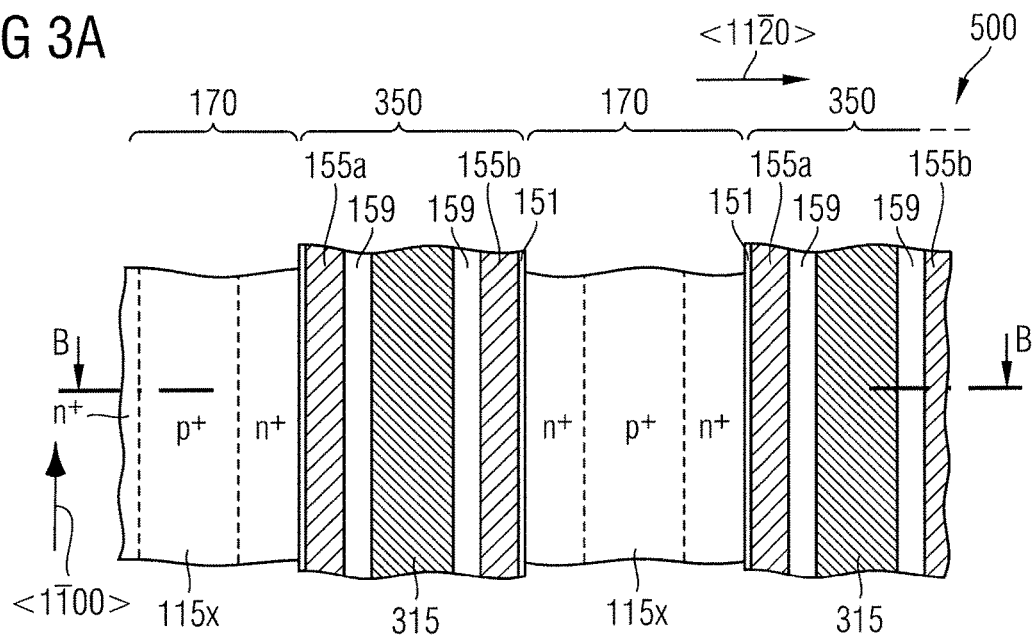
FIG. 3A is a schematic horizontal cross-sectional view of a portion of a semiconductor device in accordance with an embodiment related to implanted body contact zones and a body diode formed as an integrated merged pin Schottky diode.
Figure 3B:
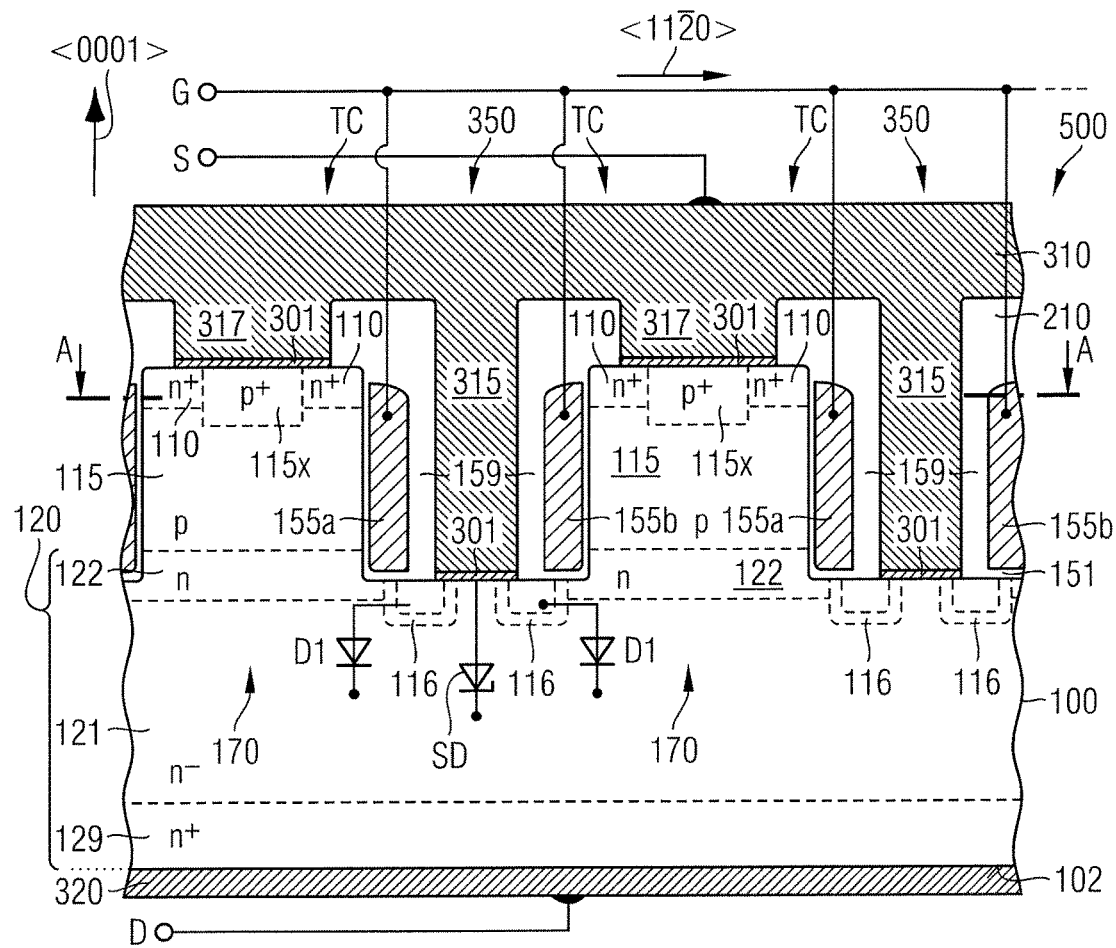
FIG. 3B is a schematic vertical cross-sectional view of the semiconductor device portion of FIG. 3A along line B-B.

The semiconductor device 500 of FIGS. 3A to 3B is an n-channel SiC-FET and differs from the SiC-FET of FIGS. 2A to 2B as regards the contacts to the body zones 115 and as regards the type of the body diode. For further details reference is made to the description of the previous FIGS.

Instead of mesa contact structures extending into the semiconductor body 100, the SiC-FET of FIGS. 3A and 3B includes planar mesa contact structures 317 as well as an implanted body contact zone 115x extending from the first surface 101 into the transistor mesas 170. A vertical extension of the body contact zones 115x is greater than a vertical extension of the source zones 110. Planar mesa contact structures 317 may save up to two photolithographic patterning processes and reduce process complexity. For example, the removal of spacers of the material of the gate electrodes 155 in mesa contact grooves may become obsolete.

The contact structures 315 of the trench structures 350 may directly adjoin both the diode region 116 and the drift zone 121, wherein interfaces between the contact structures 315 and the diode regions 116 are ohmic contacts and interfaces between the contact structure 315 and the drift zone 121 form Schottky contacts. The third pn junctions pn3 between the diode regions 116 and the drift zone 121 form a pn or pin diode D1. The Schottky contacts between the contact structures 315 and the drift zone 121 form Schottky diodes SD parallel to the pn or pin diodes D1. The resulting MPS (merged pin Schottky) diode combines the low forward voltage drop of a Schottky diode with the high surge capability of pn diodes or pin diodes.

Figure 4A:
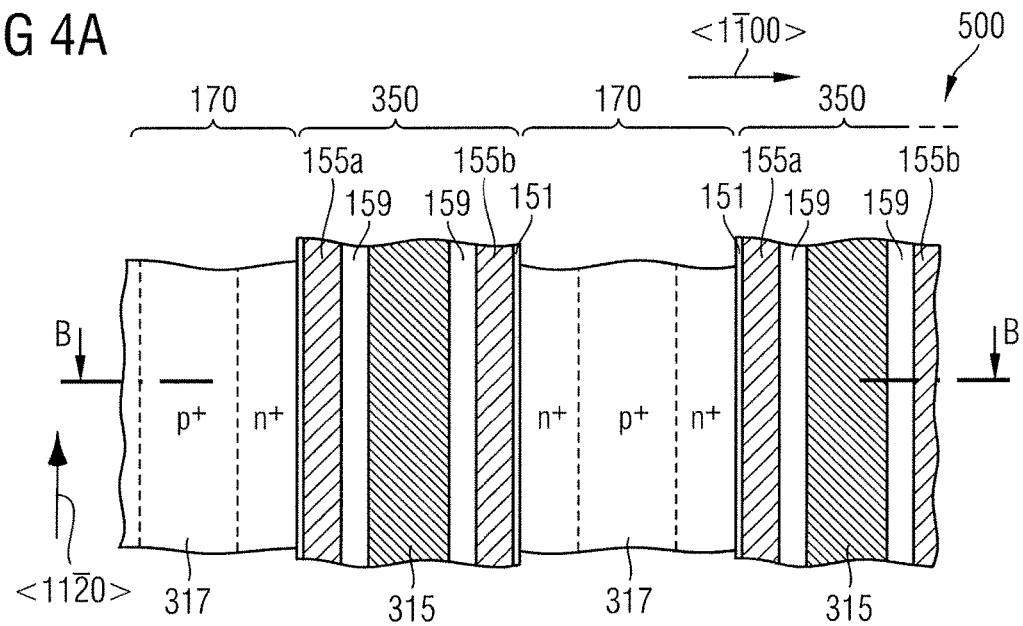
FIG. 4A is a schematic horizontal cross-sectional view of a portion of a semiconductor device in accordance with an embodiment related to a body diode formed as a depletable n-channel diode.
Figure 4B:
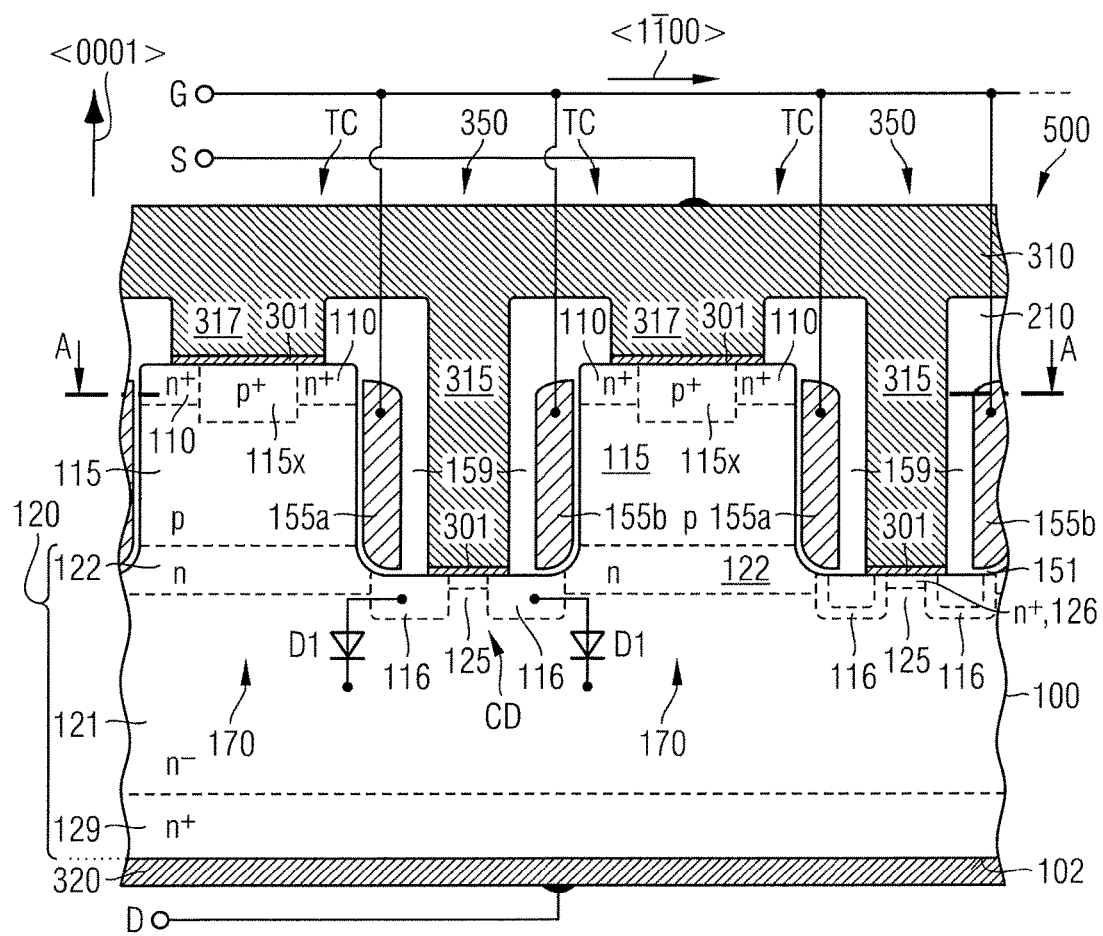
FIG. 4B is a schematic vertical cross-sectional view of the semiconductor device portion of FIG. 4A.

The semiconductor device 500 of FIGS. 4A to 4B is an n-channel SiC-FET that differs from those of FIGS. 2A to 2B and FIGS. 3A to 3B as regards the orientation of the crystal lattice. In FIG. 4A the principal <0001> crystal direction may be slightly tilted to the perpendicular of the drawing plane. The <11-20> crystal direction may run parallel to the trench structures 350 and slightly tilted to the drawing plane by the off-axis angle α. Vertical sidewalls of the transistor mesas 170 may be {1-100} crystal planes.

In FIG. 4B the <0001> crystal direction is tilted by the off-axis angle α to the drawing plane and the <11-20> crystal direction is tilted to the perpendicular onto the drawing plane by the off-axis angle α.

As a result, one of the sidewalls of each transistor mesa 170 is an (1-100) crystal plane and the other one a (−1100) crystal plane. Both sidewalls have identical surface properties such that both trench sidewalls are identical with respect to the charge carrier mobility. Along both sidewalls a current density is equal and overall current distribution more uniform. The corners of the trench structures 350 may be rounded to improve reliability of the gate dielectric 151.

Instead of a Schottky contact as illustrated in FIGS. 3A to 3B, the body diode of a transistor cell TC includes an n-channel diode CD with a forward voltage comparable to the forward voltage of a Schottky diode. The channel diode CD includes an $n^+$-type diode contact zone 126 directly adjoining the contact structure 315 and an $n^-$-type or n-type microchannel 125 connecting the $n^+$-type diode contact zone 126 with the drift zone 121, wherein the n-type microchannel 125 is surrounded by the diode region 116, which forms the pn or pin diodes D1. A width of the microchannel 125 is at most 1000 nm such that a depletion zone extending from the interface with the diode region 116 into the microchannel 125 completely depletes the microchannel 125 when no voltage is applied or when a positive drain voltage is applied such that the n-microchannel 125 shorts the pn or pin diode D1 only when a sufficiently negative drain voltage is applied.

FIG. 5A refers to embodiments with stripe-shaped trench structures 350 separated by stripe-shaped transistor mesas 170. A termination trench 360 crossing, e.g., running orthogonal to the trench structures 350 may connect the trench structures 150. A portion of the gate electrode 155 in the termination trench 360 may form or may be electrically connected to a gate pad. In the end portions the trench structures 150 may include wide portions of the gate insulator 159. Neighboring diode regions 116 are separated from each other in the horizontal directions and each diode region 116 is assigned to one single contact structure 315.

FIG. 5B refers to an embodiment with the transistor mesas 170 forming a grid and surrounding the trench structures 350, which are formed in the meshes of the grid. The trench structures 350 may be dot-shaped with a first horizontal extension w1 at most five times, for example at most two times exceeding a second horizontal dimension w2 orthogonal to the first horizontal dimension w1. A horizontal cross-section of the trench structures 350 may be a rectangle with or without rounded corners, an oval or an ellipse.

According to an embodiment, the first and the second horizontal dimensions w1, w2 are equal or deviate from each other by not more than 10%. A horizontal cross-sectional area of the trench structures 350 may be a regular polygon such as a square, a hexagon or an octagon, or a circle. The material of the gate electrode 155 may form a layer covering the transistor mesas 170, wherein the layer includes insulated openings for the contact structures 315 and the mesa contact structures 317. According to other embodiments, the gate electrode 155 in the transistor cells TC may be electrically connected to a wiring layer through contact vias.

Figure 5C:
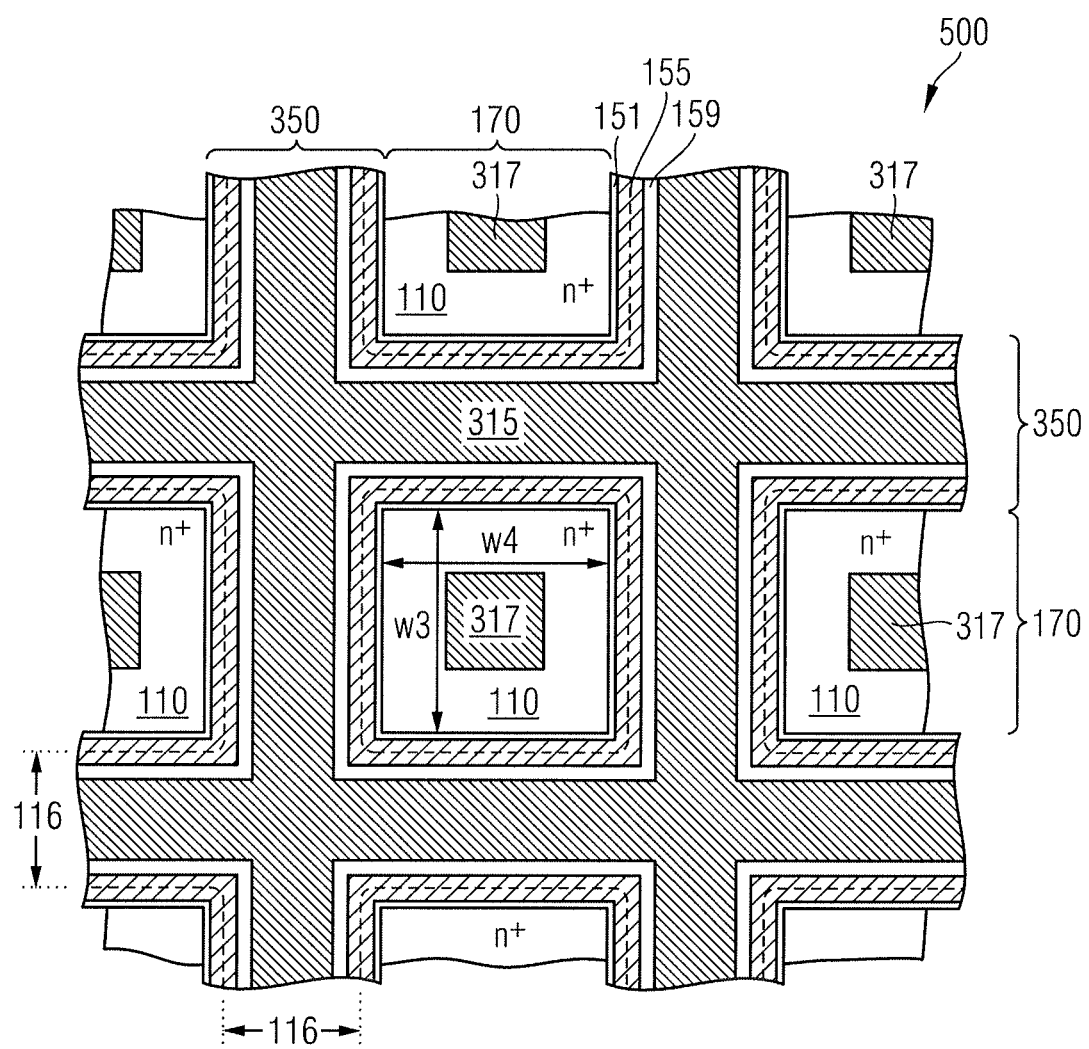
FIG. 5C is a schematic horizontal cross-sectional view of a portion of a semiconductor device in accordance with an embodiment related to trench structures forming a grid.

In FIG. 5C, the trench structures 350 form a grid with the transistor mesas 170 forming the meshes of the grid.

A first horizontal dimension w3 of the transistor mesas 170 may be at most five times, for example at most two times as large as a second horizontal dimension w4 orthogonal to the first horizontal dimension w3. A horizontal cross-sectional area of the transistor mesas 170 may be a rectangle with or without rounded corners, an ellipse or an oval. According to an embodiment, the first and the second horizontal dimensions w3, w4 deviate from each other by not more than 10% or are equal, wherein the horizontal cross-sectional areas of the transistor mesas 170 are regular polygons such as squares, hexagons or octagons, or circles. All direct connection lines between all pairs of neighboring transistor mesas 170 cross an intermediate contact structure 315.

Figure 6A:
FIG. 6A is a schematic vertical cross-sectional view of a portion of a base substrate for illustrating a method of manufacturing a semiconductor device including trench structures in which contact structures extend through gate structures, according to a further embodiment.
Figure 6B:
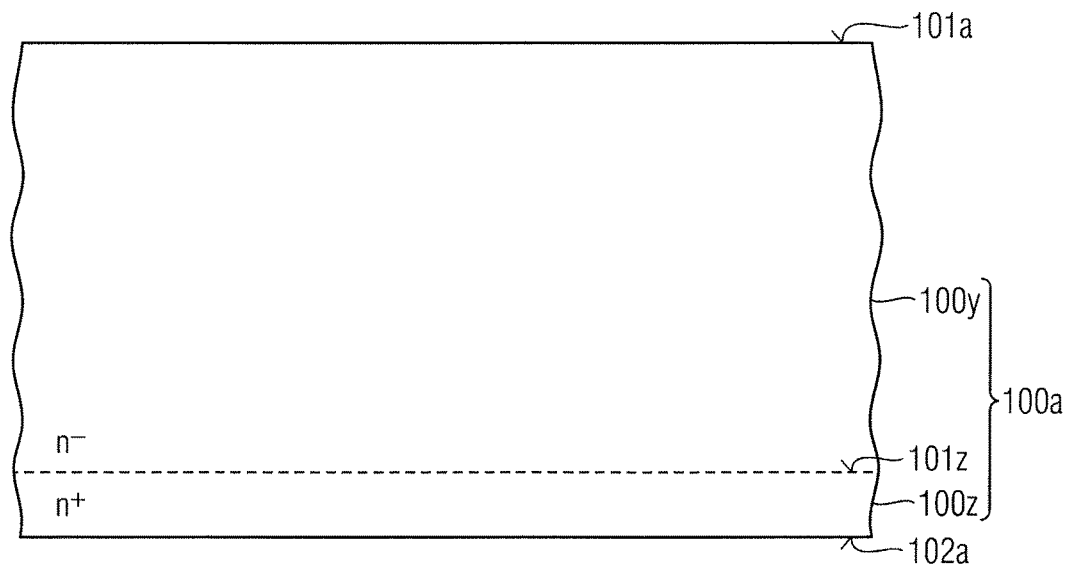
FIG. 6B shows a portion of a semiconductor substrate obtained by growing by epitaxy an epitaxial layer on the base substrate of FIG. 6A.
Figure 6E:
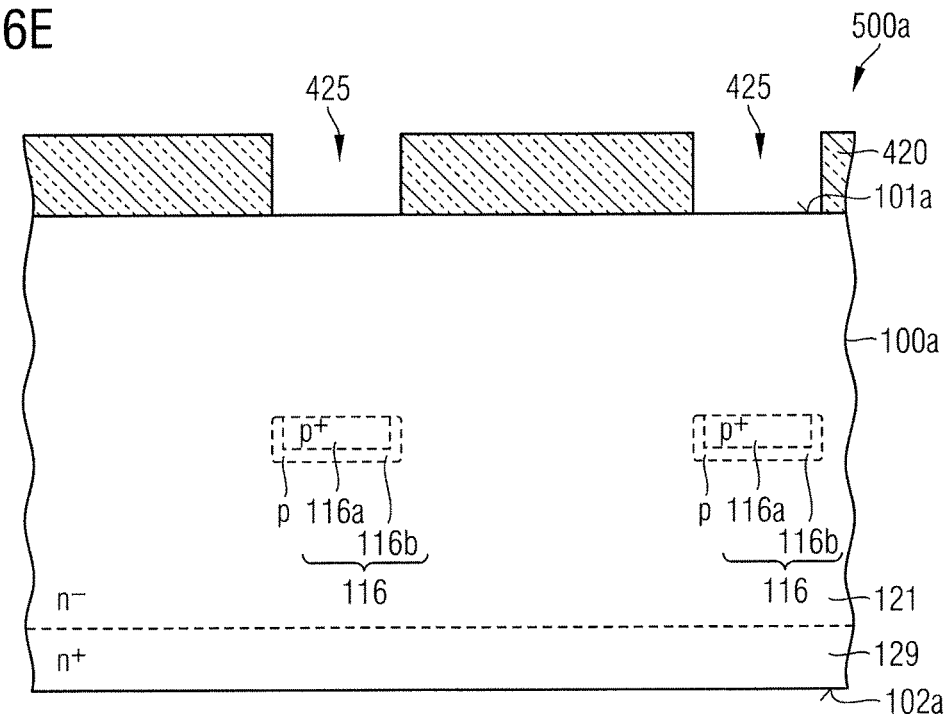
FIG. 6E shows the semiconductor substrate portion of FIG. 6D, after forming extension portions of the diode regions using the recessed first sublayer as a second mask.
Figure 6F:
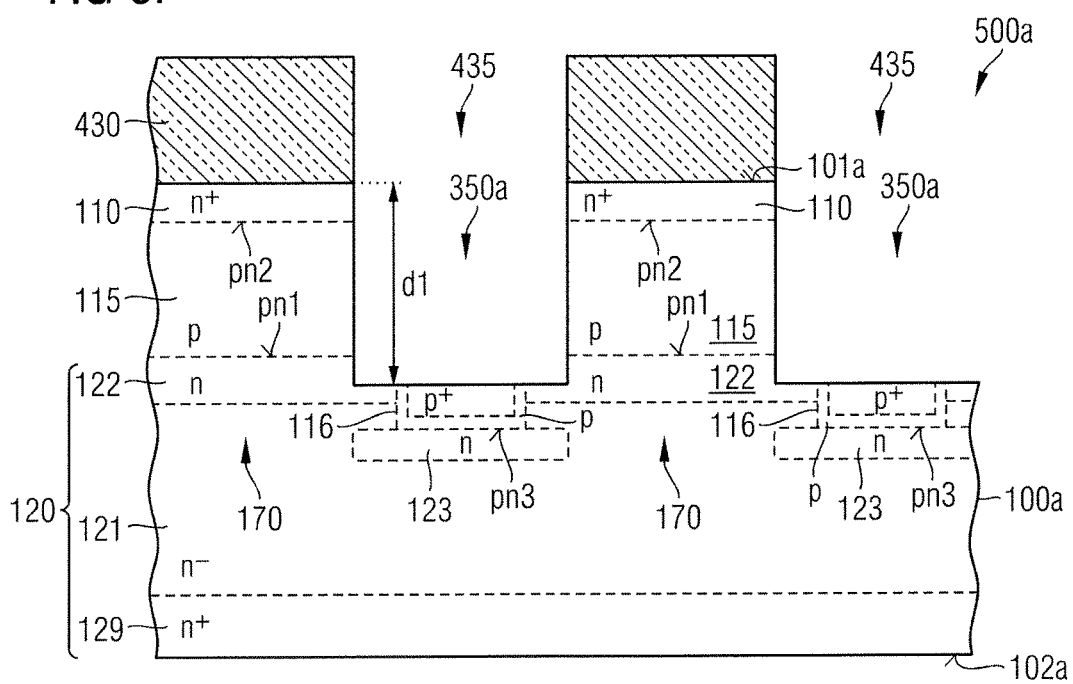
FIG. 6F shows the semiconductor substrate portion of FIG. 6E, after forming trenches, which expose the diode regions, and avalanche regulation zones in the vertical projection of the trenches by using a third mask, respectively.
Figure 6K:
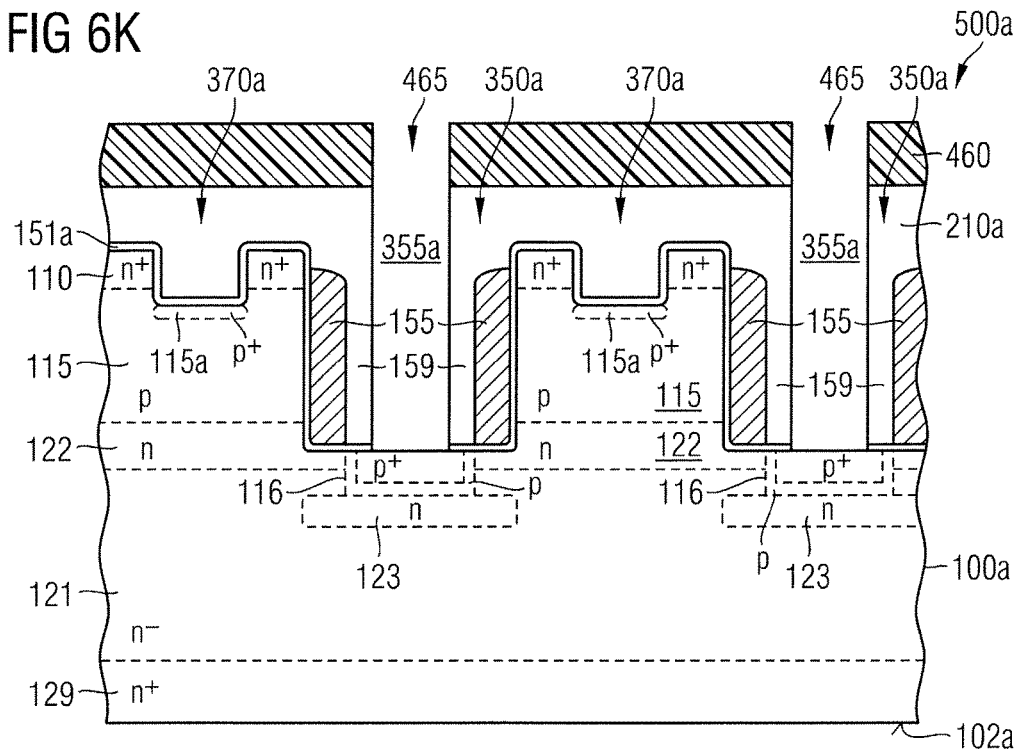
FIG. 6K is a schematic cross-sectional view of the semiconductor substrate portion of FIG. 6J, after opening the interlayer dielectric layer in the trenches by using a sixth mask.
Figure 6L:
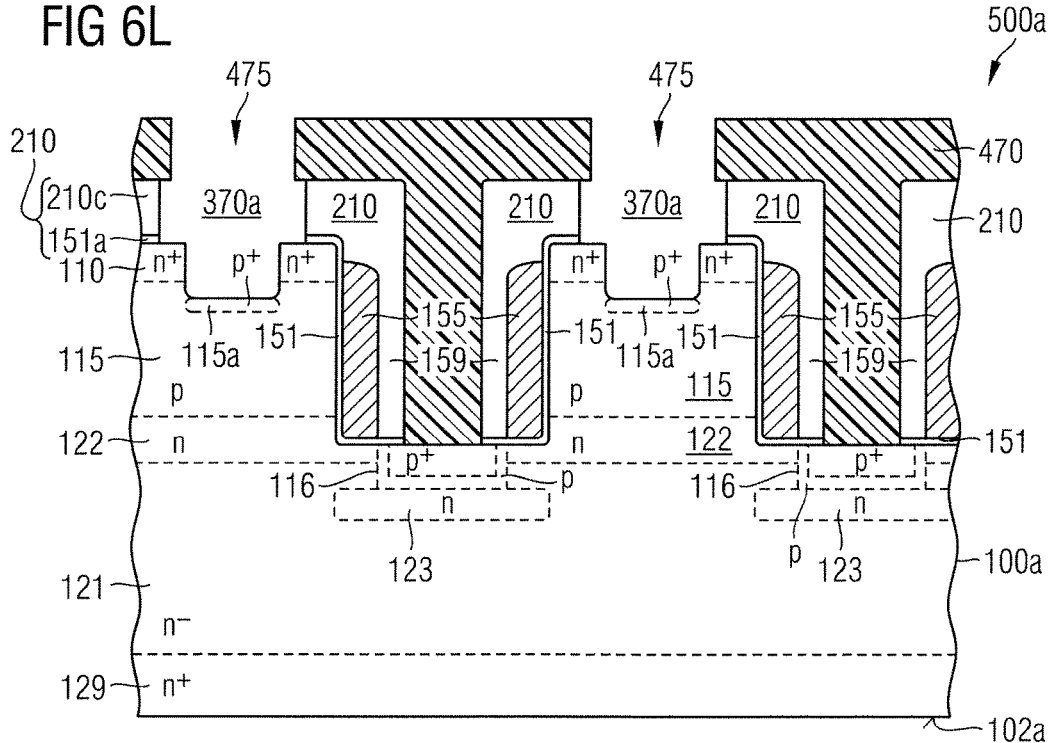
FIG. 6L shows the semiconductor substrate portion of FIG. 6K, after opening the interlayer dielectric layer in the contact grooves by using a seventh mask.
Figure 6M:
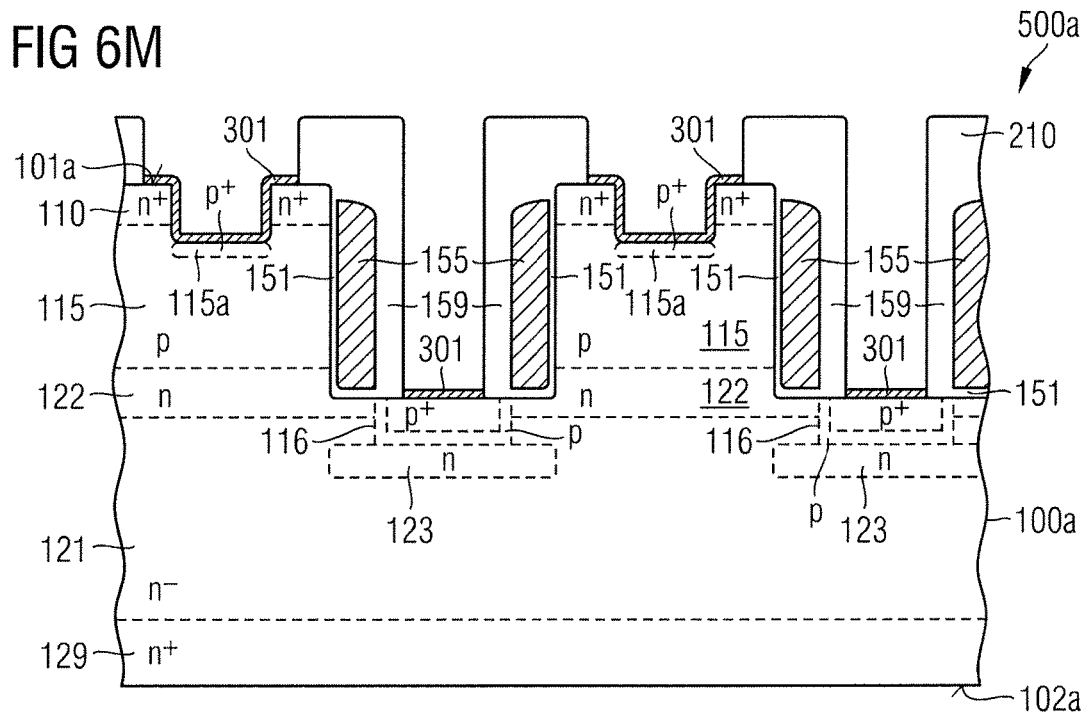
FIG. 6M shows the semiconductor substrate portion of FIG. 6L after forming contact layers in the contact grooves and in the trenches.
Figure 6N:
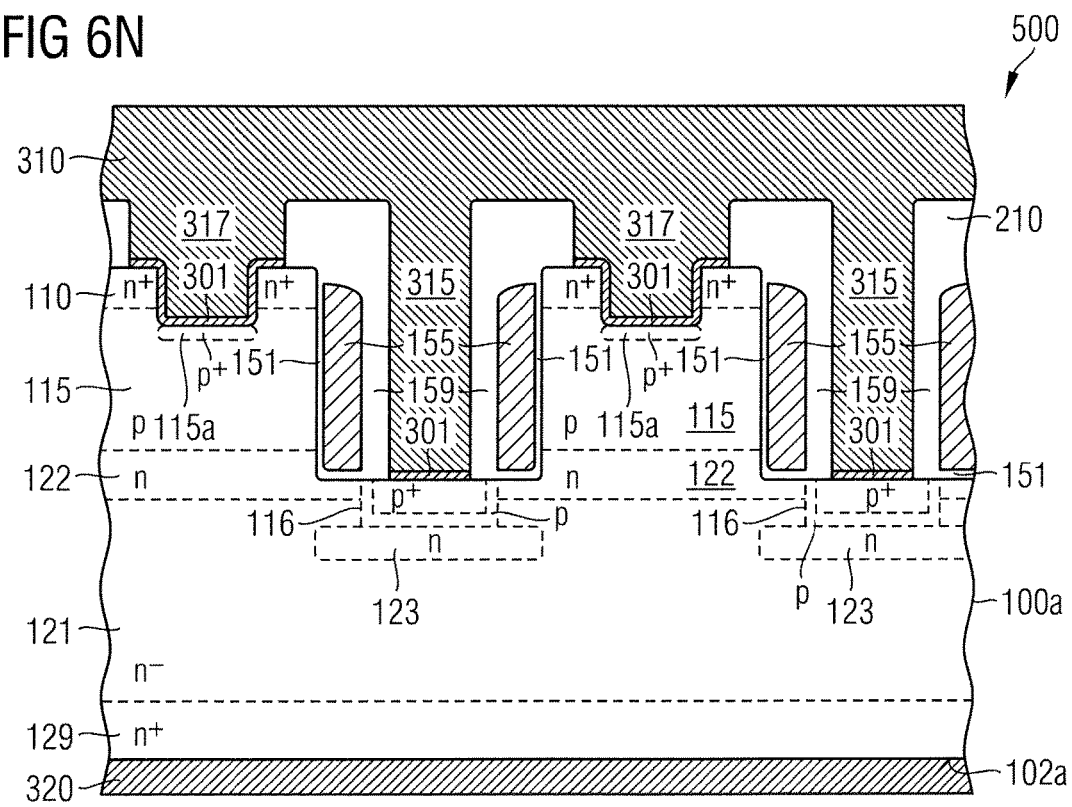
FIG. 6N shows the semiconductor substrate portion of FIG. 6M after forming a first load electrode at a front side and a second load electrode on the back.

FIGS. 6A to 6N refer to a method of manufacturing a semiconductor device with contact structures extending through trench gate structures and directly adjoining diode regions.

FIG. 6A shows a base substrate 100z which may consist of or include a single-crystalline semiconductor material, for example Si, SiC, Ge, SiGe or GaN. The base substrate 100z may be an intrinsic, a heavily n-doped or a heavily p-doped substrate obtained by, e.g., cutting or sawing a crystal ingot. According to the illustrated embodiment, the base substrate 100z is heavily n-doped.

A working surface 101z of the base substrate 100z may be planar and parallel to a main crystal plane. According to other embodiments, the working surface 101z is a staggered surface with long flat first surface sections that are crystal planes of a first type as well as short, steep second surface sections tilted to the first surface sections by an angle greater 0 degree, e.g., about 90 degree and connecting the first surface sections. According to an embodiment related to a base substrate 100z of 4H—SiC, the first surface sections may be (0001) crystal planes.

The staggered working surface 101z may result from cutting or sawing a crystal ingot based on a hexagonal crystal lattice at an off-axis angle $\alpha>0$ with respect to a main crystal direction, e.g., the <1-100> crystal direction. The off-axis angle $\alpha$ between the cut plane and the <1-100> crystal direction may be any angle in a range from about 2 to 12 degree, for example in a range from 3 to 8 degree. According to an embodiment, the off-axis angle $\alpha$ is approximately 4 degree. The cut plane may coincide with or is parallel to a mean surface plane that may be the least squares mean plane, which may cut the first and second surface sections at the half step size in case all first surface sections have the same area.

An epitaxial layer 100y is grown by epitaxy on the working surface 101z of the base substrate 100z, wherein the crystal lattice of the epitaxial layer 100y grows in registry with the crystal lattice of the base substrate 100z. In case of semiconductor materials with hexagonal crystal lattice, e.g. 4H—SiC, the staggered working surface 101z facilitates a step-controlled epitaxy during which silicon and carbon atoms impinge on the staggered working surface 101z and start ordered crystal growth along the steps.

FIG. 6B shows a semiconductor portion 100a including the epitaxial layer 100y and the base substrate 100z. The epitaxial layer 100y may be in-situ doped and may have the same conductivity type as the base substrate 100z. A mean dopant concentration in the epitaxial layer 100y may be in a range from $1E14$ $cm^{-3}$ to $3E16$ $cm^{-3}$ in case the semiconductor substrate 100a is a 4H—SiC substrate. A top surface 101a of the semiconductor portion 100a is formed by the epitaxial layer 100y and may be planar or may be staggered in case the semiconductor portion 100a is a 4H—SiC substrate. The exposed surface of the base substrate 100z opposite to the top surface 101a forms a bottom surface 102a.

A first mask structure is deposited on the top surface 101a and patterned by photolithography to form a first mask 410. Dopants of a conductivity type opposite to the conductivity type of the epitaxial layer 100y are implanted, wherein the first mask 410 is effective as an implant mask. The implant forms contact portions 116a of diode regions in a distance d1 to the top surface 101a.

FIG. 6C shows a semiconductor substrate 500a including the semiconductor portion 100a and the first mask 410, which may include one single layer or which may include a layer stack. In the illustrated embodiment, the first mask 410 includes a first sublayer 411 of a first mask material deposited on the top surface 101a and a second sublayer 412 from a second mask material deposited on the first sublayer 411. The first and second mask materials differ in their etching properties such that the first mask material may be etched isotropically at a higher rate than the second mask material. According to an embodiment the first sublayer 411 may be a silicon oxide layer and the second sublayer 412 may be a layer of polycrystalline silicon, carbon or silicon nitride, by way of example.

Openings 415 in the first mask 410 may be stripes arranged at a regular pitch, may be dot-shaped with two orthogonal horizontal dimensions within the same order of magnitude or may form a grid. The contact portions 116a are formed at the distance d1 to the top surface 101a in the vertical projection of the openings 415.

The first sublayer 411 may be isotropically recessed, wherein the recess is selective with respect to the second sublayer 412. According to another embodiment the second sublayer 412 is saved and the first mask 410 consists of the first sublayer 411 which may be isotropically recessed without being covered during the recess.

FIG. 6D shows the recessed first sublayer 411x and the unrecessed second sublayer 412 covering the recessed first sublayer 411x.

The second sublayer 412 may be removed and the recessed first sublayer 411 may form a second mask 420. Using the second mask 420 further dopants are implanted to form extension portions 116b of the diode regions in the vertical projection of openings 425 in the second mask 420.

FIG. 6E shows diode regions 116 including the heavily doped contact portions 116a and the more lightly doped extension portions 116b, respectively. The extension portions 116b extend from the contact portions 116a in the horizontal directions and into the direction of the bottom surface 102a.

A third mask 430 is formed, e.g., from a silicon oxide layer, either by removing the second mask 420, depositing a third mask layer and patterning the third mask layer by photolithography, or by further isotropically recessing the second mask 420. Openings 435 in the third mask 430 are formed in the vertical projection of the diode regions 116. Using the third mask 430 as an etch mask, trenches 350a are etched from the top surface 101a down to at least the diode regions 116. A horizontal width of the trenches 350a may be greater than the corresponding horizontal width of the diode regions 116. Using, before or after the trench etch, the third mask 430 as an implant mask, dopants of the conductivity type of the epitaxial layer 100y may be implanted to form avalanche regulation zones 123 in the vertical projection of the trenches 350a between the diode regions 116 and the bottom surface 102a.

FIG. 6F shows the avalanche regulation zones 123 directly adjoining the diode regions 116 and formed in the vertical projection of the trenches 350a that extend from the top surface 101a down to the diode regions 116. A vertical extension of the trenches 350a is equal to or greater than the first distance d1.

After removal of the second mask 420 of FIG. 6E and before forming the third mask 430, before forming the first mask 410 of FIG. 6C, or after removing the third mask 430 several implants may be performed, which are unmasked within transistor cell areas. The—with respect to the transistor cell areas—unmasked implants form $n^+$-doped source regions 110 directly adjoining the top surface 101a, p-doped body regions 115 forming second pn junctions pn2 with the source zones 110 and first pn junctions pn1 with an n-doped drift structure 120 that includes at least a contact layer 129 formed from the base substrate 100z of FIG. 6B and a drift zone 121 formed from portions of the epitaxial layer 100y with the original in-situ doping of the epitaxial layer 100y of FIG. 6B. According to an embodiment a further implant may form current spread zones 122 within the drift structure 120 and sandwiched between the body zones 115 and the drift zone 121, wherein a mean dopant concentration in the current spread zones 122 is at least two times as high as a mean dopant concentration in the drift zone 121.

FIG. 6F shows the source zones 110 and the body zones 115 completely formed in transistor mesas 170, which are sections of the semiconductor portion 100a between neighboring trenches 350a.

The third mask 430 is removed and a fourth mask 450 may be formed, for example by depositing a fourth mask layer and patterning the fourth mask layer by photolithography, wherein openings 445 in the fourth mask 440 expose portions of the transistor mesas 170 spaced from both neighboring trenches 350a, respectively. According to another embodiment, the fourth mask 440 may be formed in a self-aligned manner, for example by filling, before removing the third mask 430 of FIG. 6F, the openings 435 in the third mask 430 and the trenches 350a with an auxiliary material, removing the third mask 430 selectively to the auxiliary material and forming spacers along exposed vertical sidewall portions of the auxiliary material.

Using the fourth mask 440 as an etch mask, contact grooves 370a may be etched into the transistor mesas 170. Using the fourth mask 440 as an implant mask, dopants of the conductivity type of the body zones 115 may be implanted through the bottom of the contact grooves 370a to form heavily doped contact portions 115a of the body zones 115 or implanted body contact zones extending from the top surface 101a to the body zones 115. The material of the fourth mask 440 may be silicon oxide, by way of example.

FIG. 6G shows the contact grooves 370a extending from the first surface 101a down to at least the body zones 115 as well as heavily doped contact portions 115a along the bottom of the contact grooves 370a.

The fourth mask 440 may be removed and a high temperature anneal may activate the implanted dopants. A gate dielectric layer 151a may be formed by a thermal treatment of the exposed semiconductor material, by depositing one or more layers of dielectric material, or by a combination of thermal growth and deposition. A gate conductor material is deposited on the gate dielectric layer 151a, wherein the gate conductor material is deposited as a conformal gate conductor layer 155a.

FIG. 6H shows the gate dielectric layer 151a lining the contact grooves 370a as well as the trenches 350a. The material of the gate dielectric layer 151a may include a semiconductor dielectric, for example silicon oxide or silicon nitride or a combination thereof. The conformal gate conductor layer 155a covers the gate dielectric layer 151a at uniform thickness. The gate conductor layer 155a may consist of or include a heavily doped polycrystalline silicon layer and/or a metal containing layer.

From the gate conductor layer 155a gate electrodes 155 are formed as spacer structures extending along the vertical sidewalls of the trenches 350a by anisotropically etching a conformal gate conductor layer 155a as depicted in FIG. 6H.

A fifth mask 450 may be formed by depositing a mask material which is selectively etchable against the material of the gate conductor layer 155a and the gate dielectric layer 151a, e.g., a photoresist or carbon layer and patterning the deposited mask material by photolithography to form openings exposing spacer-like remnants 155q of the gate conductor layer 155a of FIG. 6M in the contact grooves 370a.

FIG. 6I shows the remnants 155q of the gate conductor layer. The remnants 155q extend as spacers along the vertical sidewalls of the contact grooves 370a. Openings 455 in the fifth mask layer 450 expose the contact grooves 370a. Further remnant portions of the gate conductor layer 155a of FIG. 6H form a gate electrode 155 with spacer portions formed along vertical sidewalls of the trenches 150a and covered by the fifth mask 450.

Using the fifth mask 450 as an etch mask the remnants 155q of the gate conductor layer in the contact grooves 370a are removed, for example by means of a wet etching that is selective with respect to the material of the gate dielectric layer 151a. The fifth mask 450 is removed and an interlayer dielectric layer 210a may be deposited. According to an embodiment, the interlayer dielectric layer 210a fills the contact grooves 370a and the trenches 350a completely.

FIG. 6J shows the interlayer dielectric layer 210a filling the contact grooves 370a and the trenches 350a. The interlayer dielectric layer 210a may consist of or include a silicate glass, for example phosphorus silicate glass (PSG), boron silicate glass (BSG), or boron phosphorus silicate glass (BPSG). According to other embodiments, the interlayer dielectric layer 210a may include a deposited oxide layer, for example a silicon oxide layer based on tetraethylorthosilicate (TEOS) as precursor material.

A sixth mask 460 may be formed by depositing a sixth mask layer and patterning the sixth mask layer by photolithography to form openings 465 in the vertical projection of center portions of the trenches 350a. Using the sixth mask 460 as an etch mask contact openings 355a are etched into the interlayer dielectric layer 210a and the gate dielectric layer 151a, wherein the contact openings 355a extend through the interlayer dielectric layer 210a and the gate dielectric layer 151a down to the bottom of the trenches 350a.

FIG. 6K shows the sixth mask 460 which may be formed from, for example, a photoresist. The contact openings 355a are spaced from the spacer portions of the gate electrode 155. Portions of the interlayer dielectric layer 210a between the contact openings 355a and the spacer portions of the gate electrode 155 form gate insulators 159.

The sixth mask 460 is removed and a seventh mask 470 is formed by depositing a mask material filling the contact openings 355a. Openings 475 in the seventh mask 470 are formed in the vertical projection of the contact grooves 370a. Using the seventh mask 470 as an etch mask, portions of the interlayer dielectric layer 210a and the gate dielectric layer 151a within and in the vertical projection of the contact grooves 370a are removed. The removal may include an anisotropic component that to some degree undercuts the seventh mask 470. For example, the patterning of the interlayer dielectric layer 210a may include a dry etching and a wet etching that may follow the dry etching.

FIG. 6L shows the gate insulators 159 and an interlayer dielectric 210 emerging from the interlayer dielectric layer 210a of FIG. 6J by using the sixth and seventh masks 460, 470 as etch masks. Remaining portions of the gate dielectric layer 151a of FIG. 6J form a gate dielectric 151 separating the gate electrode 155 from the semiconductor portion 100a.

The seventh mask 470 is removed and contact layers may be formed at the bottom of the trenches 350a and in the contact grooves 370a. For example, a metal layer containing a metal that forms a silicide is deposited. A heating treatment heats up the semiconductor substrate 500a such that the deposited metal reacts with the material of the semiconductor portion 100a but not with the interlayer dielectric 210. For example, the contact metal forms a first silicide along the interface with the semiconductor portion 100a. Unreacted remnants of the metal layer are removed, for example through a wet cleaning step, wherein portions of the metal layer deposited on the interlayer dielectric 210 may be removed. Then a further heat treatment may form a low-ohmic and stable second silicide from the first silicide.

FIG. 6M shows the fully silicided contact layers 301 lining sidewalls and the bottom of the contact grooves 370a as well as exposed portions of the diode regions 116 at the bottom of the trenches 350a. The contact layers 301 may include portions on the top surface 101a directly adjoining the contact grooves 370a.

A first load electrode 310 may be formed at the front side and a second load electrode 320 may be formed on the back.

FIG. 6N shows the first load electrode 310 which may be a single layer or which may be a layer stack including two or more sublayers of different materials. Mesa contact structures 317 formed in the contact grooves 370a electrically connect the first load electrode 310 with the source and body zones 110, 115. Contact structures 315 electrically connect the first load electrode 310 with the buried diode regions 116. In addition to the first load electrode 310, a gate pad may be formed from the same material(s) as the first load electrode 310.

On the back the second load electrode 320 directly adjoins the bottom surface 102a and forms an ohmic contact with the contact layer 129. From the semiconductor substrate 500a a plurality of semiconductor dies for identical semiconductor devices may be obtained by sawing or cutting, by way of example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   trench structures extending from a first surface of a semiconductor body of the semiconductor device into the semiconductor body wherein each trench structure comprises a gate structure and a contact structure that extends through the gate structure;
   transistor mesas between adjacent pairs of respective trench structures, each transistor mesa comprising a body zone forming a first pn junction with a drift structure and a second pn junction with a source zone; and
   diode regions directly adjoining each of respective contact structures and forming a third pn junction with the drift structure, respectively, and wherein the drift structure comprises a drift zone and current spread zones, wherein the current spread zones form the first pn junctions with the body zone between respective diode regions and respective current spread zones extend between respective diode regions and separate respective diode regions and body zones and wherein a mean dopant concentration in the current spread zones is at least twice as high as a mean dopant concentration in the drift zone.

2. The semiconductor device of claim 1, wherein the trench structures are stripe-shaped.

3. The semiconductor device of claim 1, wherein a first width of the trench structures parallel to a mean surface plane of the semiconductor body is at most five times a second width parallel to the mean surface plane and orthogonal to the first width.

4. The semiconductor device of claim 3, wherein the first width deviates from the second width by not more than 10%.

5. The semiconductor device of claim 1, wherein
the contact structure is sandwiched between a first gate portion of the gate structure on a first side of the contact structure and a second gate portion of the gate structure on a second, opposite side of the contact structure.

6. The semiconductor device of claim 1, wherein the gate structure surrounds the contact structure.

7. The semiconductor device of claim 1, wherein a width of each diode region is smaller than a corresponding width of each trench structure.

8. The semiconductor device of claim 1, wherein the drift structure further comprises an avalanche regulation zone, wherein the avalanche regulation zone forms the third pn junction and a mean dopant concentration in the avalanche regulation zone is at least twice as high as a mean dopant concentration in the drift zone.

9. The semiconductor device of claim 1, further comprising mesa contact structures extending from the first surface of the semiconductor body into respective transistor mesas and directly adjoining a respective source zone and a respective body zone.

10. The semiconductor device of claim 1, further comprising body contact zones extending from the first surface of the semiconductor body into the transistor mesas and forming unipolar homojunctions with the body zones of each respective transistor mesa.

11. The semiconductor device of claim 1, further comprising a Schottky diode formed between the contact structure and the drift structure.

12. The semiconductor device of claim 1, further comprising a channel diode with a first electrode formed by the contact structure and a second electrode formed by a diode contact zone, the channel diode comprising a channel region directly adjoining the diode contact zone, the drift zone, and a respective diode region and configured to be fully depleted when no potential is applied between the drift structure and the respective diode region.

13. The semiconductor device of claim 1, wherein a material of the semiconductor body is silicon carbide.

14. The semiconductor device of claim 1, wherein a material of the semiconductor body has a hexagonal crystal lattice.

15. The semiconductor device of claim 14, wherein sidewalls of each of the transistor mesas are main crystal planes of the hexagonal crystal lattice.

16. The semiconductor device of claim 14, wherein sidewalls of each of the transistor mesas are {11-20} or {1-100} crystal planes.

17. The semiconductor device of claim 1, wherein respective gate structures each comprise a gate electrode, a gate dielectric sandwiched between the gate electrode and a respective body zone, and a gate insulator sandwiched between the gate electrode and a respective contact structure.

18. The semiconductor device of claim 1, wherein portions of the drift structure separate neighboring respective diode regions of the diode regions in planes parallel to the first surface of the semiconductor body.

19. A semiconductor device, comprising:
at least two trench structures extending from a first surface of a semiconductor body into the semiconductor body and wherein each trench structure of the at least two trench structures comprises a gate structure and a contact structure that extends through the gate structure;
a transistor mesa between adjacent pairs of respective trench structures of the at least two trench structures, the transistor mesa comprising a body zone forming a first pn junction with a drift structure and a second pn junction with a source zone; and
at least two diode regions forming third pn junctions with the drift structure and directly adjoining a respective one or more of contact structures, respectively, wherein all direct connection lines between neighboring transistor mesas intersect one of the respective one or more contact structures, the drift structure comprises a drift zone and current spread zones, wherein the current spread zones form the first pn junctions with the body zone between respective diode regions of the at least two diode regions and respective current spread zones extend between respective diode regions of the at least two diode regions and separate respective diode regions of the at least two diode regions and body zones and a mean dopant concentration in the current spread zones is at least twice as high as a mean dopant concentration in the drift zone.

20. A semiconductor device, comprising:
trench structures extending from a first surface of a semiconductor body into the semiconductor body and comprising a gate structure and a contact structure that extends through the gate structure, respectively;
transistor mesas between adjacent pairs of respective trench structures, each transistor mesa comprising a body zone forming a first pn junction with a drift structure and a second pn junction with a source zone; and
diode regions directly adjoining respective ones of the contact structures and forming a third pn junction with the drift structure, respectively, and wherein sidewalls of each of the transistor mesas are {11-20} or {1-100} crystal planes.

21. A method of manufacturing a semiconductor device, the method comprising:
forming trenches extending from a front side of a semiconductor substrate into the semiconductor substrate, wherein each trench extends down to a respective diode region of a plurality of diode regions formed in the semiconductor substrate and wherein in transistor mesas between the trenches body zones form first pn junctions with a drift structure and second pn junctions with source zones, and sidewalls of the transistor mesas are {11-20} or {1-100} crystal planes;
forming gate portions extending along opposite sidewalls of each of the trenches; and
forming respective contact structures in each of the trenches between the respective gate portions, the respective contact structures directly adjoining the respective diode regions of the plurality of diode regions.

22. The method of claim 21, wherein forming the gate portions comprises depositing a conformal gate conductor layer lining each of the trenches and removing horizontal portions of the conformal gate conductor layer by an anisotropic etch to form spacer-like gate electrode portions along respective sidewalls of each of the trenches.

23. A semiconductor device, comprising:
trench structures extending from a first surface of a semiconductor body of the semiconductor device into the semiconductor body wherein each trench structure comprises a gate structure and a contact structure that extends through the gate structure;
transistor mesas between adjacent pairs of respective trench structures, each transistor mesa comprising a body zone forming a first pn junction with a drift structure and a second pn junction with a source zone;
diode regions directly adjoining each of respective contact structures and forming a third pn junction with the drift structure, respectively, and wherein the drift structure comprises a drift zone and current spread zones, wherein the current spread zones form the first pn junctions with the body zone and a mean dopant concentration in the current spread zones is at least twice as high as a mean dopant concentration in the drift zone; a channel diode with a first electrode formed by the contact structure and and a second electrode formed by a diode contact zone, the channel diode comprising a channel region directly adjoining the diode contact zone, the drift zone, and a respective diode region and configured to be fully depleted when no potential is applied between the drift structure and the respective diode region.

\* \* \* \* \*